(12) United States Patent
Li et al.

(10) Patent No.: US 12,144,117 B2
(45) Date of Patent: Nov. 12, 2024

(54) FLEXIBLE CIRCUIT BOARD AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Fan Li, Beijing (CN); Wenxiao Niu, Beijing (CN); Ji Wang, Beijing (CN); Yunhan Xiao, Beijing (CN); Hengzhen Liang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 346 days.

(21) Appl. No.: 17/603,395

(22) PCT Filed: Dec. 25, 2020

(86) PCT No.: PCT/CN2020/139459
§ 371 (c)(1),
(2) Date: Oct. 13, 2021

(87) PCT Pub. No.: WO2022/134013
PCT Pub. Date: Jun. 30, 2022

(65) Prior Publication Data
US 2022/0240386 A1     Jul. 28, 2022

(51) Int. Cl.
*H05K 1/18*     (2006.01)
*H05K 1/11*     (2006.01)

(52) U.S. Cl.
CPC ............ *H05K 1/189* (2013.01); *H05K 1/118* (2013.01); *H05K 2201/10136* (2013.01)

(58) Field of Classification Search
CPC ...... H05K 1/189; H05K 1/118; H05K 3/4691; H05K 3/4635; H05K 2201/10128;
(Continued)

(56) References Cited

U.S. PATENT DOCUMENTS 9,462,684 B2    10/2016   Yanaka et al.
10,559,603 B2    2/2020   Chen
(Continued)

FOREIGN PATENT DOCUMENTS

CN      104460119 A     3/2015
CN      105430889 A     3/2016
(Continued)

OTHER PUBLICATIONS

Office Action, including search report, for Chinese patent application No. 202080003650.5, dated Jun. 26, 2024, 12 pages.

*Primary Examiner* — Roshn K Varghese
(74) *Attorney, Agent, or Firm* — Westman, Champlin & Koehler, P.A.

(57) ABSTRACT

A flexible circuit board including: a body area including a plurality of wirings; a bonding area combined with a first side of the body area; and an extension area combined with a second side of the body area opposite to the first side. The body area includes a first sub-body area and a second sub-body area located on a side of the first sub-body area close to the extension area; the plurality of wirings at least include a first wiring, a second wiring and a third wiring all extend in the first sub-body area, and the first wiring and the second wiring extend in the second sub-body area. The first sub-body area includes a multi-layer board structure, the second sub-body area includes a single-layer board structure or a double-layer board structure, and a thickness of the second sub-body area is smaller than a thickness of the first sub-body area.

19 Claims, 22 Drawing Sheets

(58) Field of Classification Search
CPC . H05K 2201/0191; H05K 2201/10136; H05K 2201/09227; H05K 2203/061
See application file for complete search history.

(56) References Cited

U.S. PATENT DOCUMENTS

| | | | |
|---|---|---|---|
| 11,930,587 B2 | 3/2024 | Li et al. | |
| 2004/0112632 A1* | 6/2004 | Michiwaki | H05K 3/4691 |
| | | | 174/254 |
| 2010/0182293 A1 | 7/2010 | Minamino et al. | |
| 2012/0186860 A1* | 7/2012 | Takaoka | H05K 1/028 |
| | | | 174/254 |
| 2014/0369009 A1* | 12/2014 | Cho | H05K 1/118 |
| | | | 361/749 |
| 2019/0244974 A1 | 8/2019 | Chen | |
| 2021/0084777 A1* | 3/2021 | Adjiwibawa | H05K 1/183 |
| 2023/0164907 A1 | 5/2023 | Li et al. | |

FOREIGN PATENT DOCUMENTS

| | | |
|---|---|---|
| CN | 205355310 U | 6/2016 |
| CN | 105792516 A | 7/2016 |
| CN | 107180594 A | 9/2017 |
| CN | 108241240 A | 7/2018 |
| CN | 208143584 U | 11/2018 |
| CN | 208490034 U | 2/2019 |
| CN | 209218456 U | 8/2019 |
| CN | 110430678 A | 11/2019 |
| CN | 211090137 U | 7/2020 |
| CN | 111511098 A | 8/2020 |
| CN | 112002246 A | 11/2020 |
| JP | WO2009004894 A1 | 8/2010 |
| WO | 2020/156595 A2 | 8/2020 |

\* cited by examiner

AL3

AL4

AL5

AL6

FLEXIBLE CIRCUIT BOARD AND DISPLAY DEVICE

CROSS REFERENCE TO RELATED APPLICATION(S)

This application is a Section 371 National Stage Application of International Application No. PCT/CN2020/139459, filed on Dec. 25, 2020, entitled "FLEXIBLE CIRCUIT BOARD AND DISPLAY DEVICE", the contents of which are incorporated herein by reference in their entireties.

TECHNICAL FIELD

The present disclosure relates to a field of display technology, and in particular, to a flexible circuit board and a display device.

BACKGROUND

Flexible Printed Circuit (FPC) is a highly reliable and flexible printed circuit board made of a base material such as a flexible film. The flexible circuit board has characteristics of high wiring density, light weight, thin thickness and good bendability and the like, and the flexible circuit board is widely used in various display devices such as a mobile phone, a computer and a monitor, and the like.

SUMMARY

In one aspect, a flexible circuit board is provided, including:
  a body area including at least one driving device and a plurality of wirings;
  a bonding area combined with a first side of the body area, and the bonding area includes a plurality of bonding pins; and
  an extension area combined with a second side of the body area, and the first side and the second side are two opposite sides of the body area,
  wherein the body area includes a first sub-body area and a second sub-body area, and the second sub-body area is located on a side of the first sub-body area close to the extension area; the plurality of wirings at least include a first wiring, a second wiring and a third wiring, each of the first wiring, the second wiring and the third wiring extends in the first sub-body area, and the first wiring and the second wiring extend in the second sub-body area; and
  the first sub-body area includes a multi-layer board structure, the second sub-body area includes a single-layer board structure or a double-layer board structure, and a thickness of the second sub-body area is smaller than a thickness of the first sub-body area.

According to some exemplary embodiments, the first sub-body area includes a first size in a first direction, the first direction is perpendicular to a thickness direction of the flexible circuit board, and the first direction is directed from the bonding area to the extension area; and
  the second sub-body area includes a second size in the first direction, a ratio of a sum of the first size and the second size to the first size of the first sub-body area is in a range of 1.5 to 5.

According to some exemplary embodiments, the first size is in a range of 5 to 10 mm; and/or, the sum of the first size and the second size is in a range of 7 to 20 mm.

According to some exemplary embodiments, the first sub-body area includes a four-layer board structure.

According to some exemplary embodiments, the first sub-body area includes a first sub-circuit board, a second sub-circuit board and a protective film, and each of the first sub-circuit board and the second sub-circuit board includes a base film and conductive films on opposite sides of the base film.

According to some exemplary embodiments, the first sub-body area includes a six-layer board structure.

According to some exemplary embodiments, the first sub-body area includes a first sub-circuit board, a second sub-circuit board, a third sub-circuit board and a protective film, and each of the first sub-circuit board, the second sub-circuit board and the third sub-circuit board includes a base film and conductive films on opposite sides of the base film.

According to some exemplary embodiments, the first sub-body area includes a first sub-circuit board, a second sub-circuit board, a third sub-circuit board, a fourth sub-circuit board and a protective film, each of the first sub-circuit board and the fourth sub-circuit board includes a base film and a conductive film on a side of the base film, each of the second sub-circuit board and the third sub-circuit board includes a base film and conductive films on opposite sides of the base film, and an adhesive layer is disposed between the first sub-circuit board and the second sub-circuit board, between the second sub-circuit board and the third sub-circuit board, and between the third sub-circuit board and the fourth sub-circuit board.

According to some exemplary embodiments, the second sub-body area includes the double-layer board structure, the double-layer board structure includes a double-layer sub-circuit board, and the double-layer sub-circuit board includes a base film and conductive films on opposite sides of the base film.

According to some exemplary embodiments, one of the first sub-circuit board, the second sub-circuit board and the third sub-circuit board extends continuously with the double-layer sub-circuit board.

According to some exemplary embodiments, the second sub-body area includes the double-layer board structure, the double-layer board structure includes a double-layer sub-circuit board, and the double-layer sub-circuit board includes a base film and conductive films on opposite sides of the base film.

According to some exemplary embodiments, one of the second sub-circuit board and the third sub-circuit board extends continuously with the double-layer sub-circuit board.

According to some exemplary embodiments, the second sub-body area includes the single-layer board structure, the single-layer board structure includes a single-layer sub-circuit board, and the single-layer sub-circuit board includes a base film and a conductive film on a side of the base film.

According to some exemplary embodiments, one of the first sub-circuit board and the fourth sub-circuit board extends continuously with the single-layer sub-circuit board.

According to some exemplary embodiments, the first sub-body area includes a third size in a second direction, the second sub-body area includes a fourth size in the second direction, the second direction is perpendicular to the thickness direction of the flexible circuit board, and the second direction is perpendicular to the first direction; and the third size is equal to the fourth size, or the third size is greater than the fourth size.

According to some exemplary embodiments, the extension area includes a double-layer board structure or a single-layer board structure.

According to some exemplary embodiments, the extension area and the second sub-body area extend continuously.

According to some exemplary embodiments, as the first size of the first sub-body area increases, an area of an orthographic projection of the second sub-body area in the thickness direction of the flexible circuit board becomes decreases.

According to some exemplary embodiments, the bonding area includes a double-layer board structure or a single-layer board structure.

According to some exemplary embodiments, the bonding area and the second sub-body area are extracted from one sub-circuit board of the first sub-body area.

According to some exemplary embodiments, the bonding area and the second sub-body area are extracted from different sub-circuit boards of the first sub-body area.

In another aspect, a display device is provided, including: a display panel; the flexible circuit board as described above; and a battery, wherein the bonding area of the flexible circuit board is connected to the display panel, and the flexible circuit board is located on a non-display side of the display panel; and the battery is located on a side of the flexible circuit board away from the display panel.

According to some exemplary embodiments, an orthographic projection of the battery on the display panel at least partially overlaps with an orthographic projection of the second sub-body area on the display panel.

According to some exemplary embodiments, the display device further includes a middle frame component, at least a part of the middle frame component is located on a side of the flexible circuit board away from the display panel, and an orthographic projection of the middle frame component on the display panel at least partially overlaps with an orthographic projection of the second sub-body area on the display panel.

BRIEF DESCRIPTION OF THE DRAWINGS

In order to describe technical solutions more clearly in the embodiments of the present disclosure or the prior art, in the following, drawings needed to be used in the description of the embodiments or the prior art will be briefly introduced. Obviously, the drawings in the following description are only some embodiments of the present disclosure. For those skilled in the art, other drawings may be obtained according to the drawings without creative work.

DETAILED DESCRIPTION OF EMBODIMENTS

Figure 1:
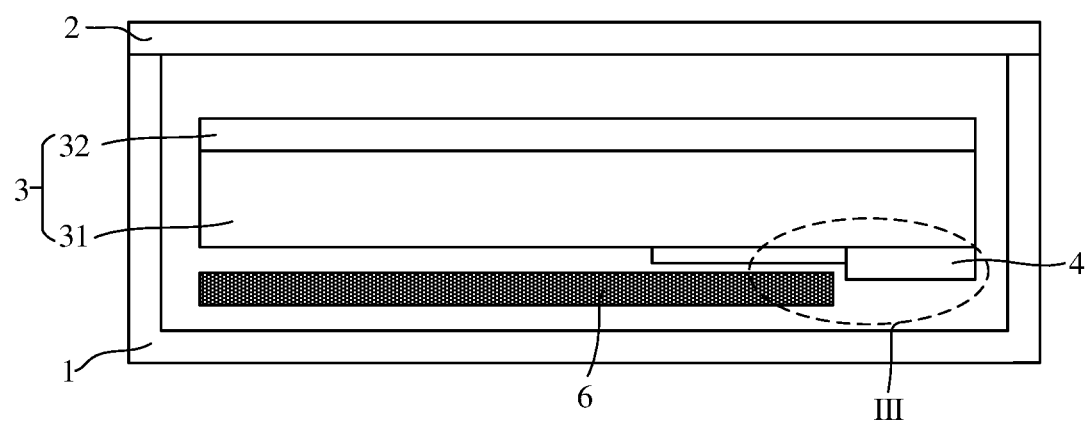
FIG. 1 illustrates a schematic diagram of a display device according to the embodiments of the present disclosure.

In order to make objectives, technical solutions, and advantages of the embodiments of the present disclosure more apparent, the technical solutions of the embodiments of the present disclosure will be described clearly and completely in conjunction with the drawings of the embodiments of the present disclosure. Obviously, the described embodiments are part of the embodiments of the present disclosure, rather than all of the embodiments. Based on the described embodiments of the present disclosure, all other embodiments obtained by those skilled in the art without creative work are within the protection scope of the present disclosure.

Unless otherwise defined, the technical terms or scientific terms used in the present disclosure shall have general meanings understood by those skilled in the art. The "first", "second" and similar words used in the present disclosure do not indicate any order, quantity or importance, but are only used to distinguish different components. "Include" or "comprise" and other similar words refer to that an element or an item appearing before the word contains an element or an item and their equivalents listed after the word, but does not exclude other elements or items. "Connected" or "coupled" and other similar words are not limited to physical or mechanical connections, but may include electrical connections, whether direct or indirect. "Up", "down", "left", "right", etc. are only used to indicate a relative positional relationship. When an absolute position of a described object changes, the relative position relationship may also change accordingly.

In the present disclosure, unless otherwise expressly stipulated and limited, the term "connected" shall be understood in a broad sense. For example, "connected" may be a fixed connection, a detachable connection or a whole; the "connected" may be directly connected or indirectly connected through an intermediary.

In the present disclosure, unless otherwise specified, the expressions "multi-layer board", "multi-layer board structure" and the like refer to a board including a stacked structure of three or more layers.

In the present disclosure, unless otherwise expressly stipulated and limited, the term "extend continuously" refers to that one component extends from another component, or that the two components are formed as a whole.

The embodiments of the present disclosure provide a flexible circuit board, the flexible circuit board includes:
- a body area, the body area includes at least one driving device and a plurality of wirings;
- a bonding area, the bonding area is combined with a first side of the body area, and the bonding area includes a plurality of bonding pins; and
- an extension area, the extension area is combined with a second side of the body area, and the first side and the second side are two opposite sides of the body area, wherein the body area includes a first sub-body area and a second sub-body area, and the second sub-body area is located on a side of the first sub-body area close to the extension area; the plurality of wirings at least include a first wiring, a second wiring and a third wiring, each of the first wiring, the second wiring and the third wiring extends in the first sub-body area, and the first wiring and the second wiring extend in the second sub-body area; and
- the first sub-body area includes a multi-layer board structure, the second sub-body area includes a single-layer board structure or a double-layer board structure, and a thickness of the second sub-body area is smaller than a thickness of the first sub-body area.

By designing a thinned part of the body area, an interference avoiding design may be achieved, so that components such as batteries and middle frame components, etc. may extend below the flexible circuit board. In this way, it is conducive to placing large-capacity batteries or performing interference avoiding on the components.

It should be understood that, a plurality of signal wirings may usually be integrated on the flexible circuit board, to transmit different types of signals. When there are many numbers and types of signal wirings on the flexible circuit board, for example, when the plurality of signal wirings for display signals, touch signals, fingerprint recognition signals, etc. are required at a same time, a wiring difficulty in the flexible circuit board will also be increased. In this way, at least a part of the flexible circuit board may be formed as a multi-layer wiring layer such as four-layer wiring layer or six-layer wiring layer, etc., so as to facilitate an arrangement of the plurality of wirings, so that the plurality of wirings may be distributed on different layers, thereby reducing mutual interference between different types of wirings. In addition, in the process of manufacturing the flexible circuit board with multi-layer wiring layers, it is also necessary to form an insulating layer (and a corresponding bonding layer) between adjacent wiring layers. In order to avoid a signal crosstalk between different wirings, it is also necessary to form a (electromagnetic signal) shielding layer between different wirings.

The embodiments of the present disclosure provide a display device, the type of the display device is not limited, and the display device may be a Liquid Crystal Display (LCD) or an electroluminescent display device. In the case that the display device is an electroluminescent display device, the electroluminescent display device may be an Organic Light-Emitting Diode (OLED) or a Quantum Dot Light Emitting Diodes (QLED).

FIG. 1 illustrates a schematic diagram of a display device. As shown in FIG. 1, a main structure of the display device includes a frame 1, a cover plate 2, a display panel 3, a flexible circuit board 4 and other components. In a case that the display device is a liquid crystal display device, the display device further includes a backlight component. Here, the display panel 3 may be a flexible display panel or a rigid display panel. In the case that the display panel 3 is a flexible display panel, the display device is a flexible display device.

For example, an upper side of the display panel 3 shown in FIG. 1 is a display side, and a lower side is a non-display side; while the flexible circuit board 4 is placed on the non-display side of the display panel 3 after being bonded. In an embodiment of the present disclosure, after the flexible circuit board 4 and the display panel 3 are bonded and connected, a bonding end of the display panel 3 is bent toward the non-display side, so that the flexible circuit board 4 is located on the non-display side of the display panel 3, that is, the flexible circuit board 4 is located on a back surface of the display panel 3, so as to achieve a narrow bezel design of a display screen.

For example, the display device provided by the embodiments of the present disclosure may be a product or component with any display function, such as a television, a digital camera, a mobile phone, a tablet computer and so on.

As shown in FIG. 1, a longitudinal section of the frame 1 is U-shaped, the display panel 3, the flexible circuit board 4 and other components are all disposed in the frame 1. The flexible circuit board 4 is placed under the display panel 3 (that is, located on the back surface away from a display surface of the display panel 3), and the cover plate 2 is disposed on a side of the display panel 3 away from the flexible circuit board 4. In the case that the display is a liquid crystal display and the liquid crystal display includes the backlight component, the backlight component is disposed between the display panel 3 and the flexible circuit board 4.

As shown in FIG. 1, the display panel 3 may include a display unit 31 and a touch layer 32, the touch layer 32 may be disposed on a light emitting side of the display unit 31. For example, in the case that the display panel 3 is an OLED display panel, the touch layer 32 may be disposed on an encapsulation layer of the OLED display panel (the touch layer 32 may be in direct contact with the encapsulation layer, or there may be other layers between the touch layer 32 and the encapsulation layer, such as a planarization layer, etc.). Wherein the encapsulation layer may be an encapsulation substrate or an encapsulation film; in the case that the display panel 3 is the liquid crystal display panel, the touch layer 32 may be embedded in a liquid crystal layer (that is, in cell); or the touch layer 32 may be disposed between a color filter substrate and an upper polarizer (that is, on cell). A position of the touch layer 32 is not limited to this, for example, the touch layer 32 may also be disposed on a side of the cover plate 2 close to the display panel 3.

Figure 2:
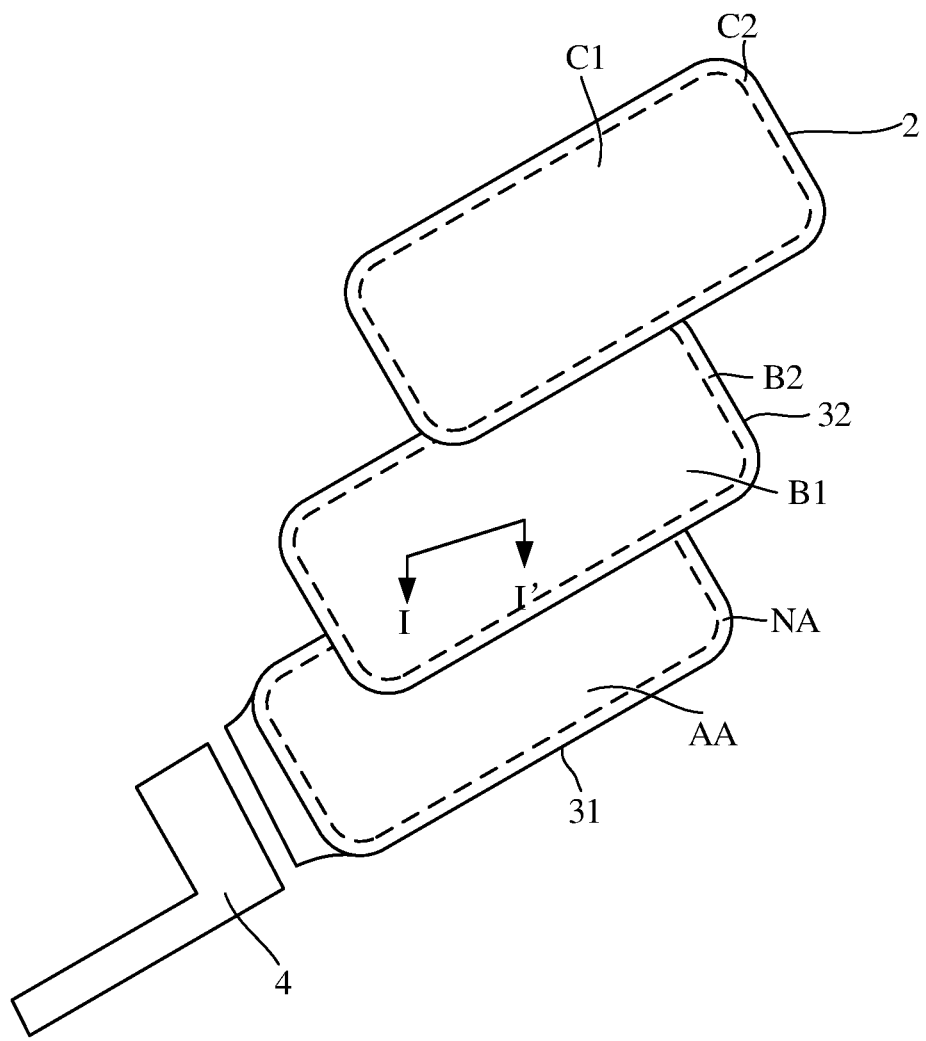
FIG. 2 is a partially exploded schematic diagram of a display device according to the embodiments of the disclosure.

FIG. 2 is a partially exploded schematic diagram of a display device according to the embodiments of the present disclosure. Referring to FIGS. 1 and 2 in combination, the display unit 31 may include a display area AA and a non-display area NA on at least one side of the display area AA. FIG. 2 illustrates an example in which the non-display area NA surrounds the display area AA. The display area AA may be limited as an area in which an image is displayed, and the display area AA includes a plurality of sub-pixels for implementing an image. The non-display area NA may be limited as an area in which no image is displayed, and the non-display area NA is used for wiring. For example, a gate driving circuit may be disposed in the non-display area NA.

In the case that a display panel 3 includes a touch layer 32, the touch layer 32 may be disposed on the display unit 31. The touch layer 32 may acquire coordinate information from external input (for example, a touch of user's finger), that is, the touch layer 32 may be a touch panel that senses the touch of user; the touch layer 32 may also be a fingerprint sensing panel that acquires fingerprint information of user's finger. For example, the touch layer 32 may sense external input through a capacitive method. It should be noted that, the sensing method of the touch layer 32 in the embodiments of the present disclosure includes but is not limited to the above-mentioned embodiments, and other suitable sensing methods should fall within the protection scope of the embodiments of the present disclosure.

Figure 3A:
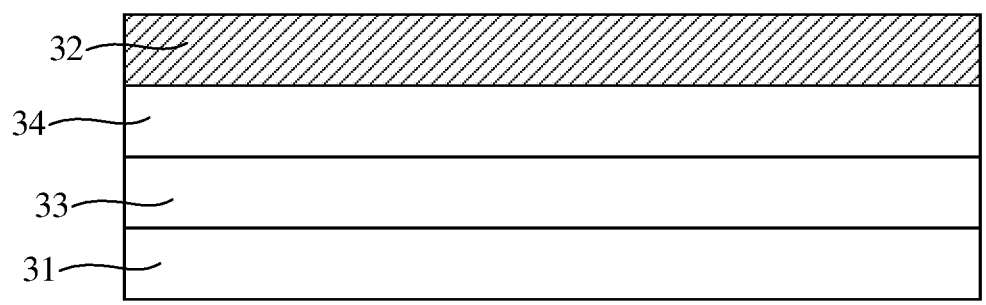
FIGS. 3A and 3B are schematic cross-sectional views of the display device taken along line I-I' in FIG. 2 according to the embodiments of the disclosure, respectively.
Figure 3B:
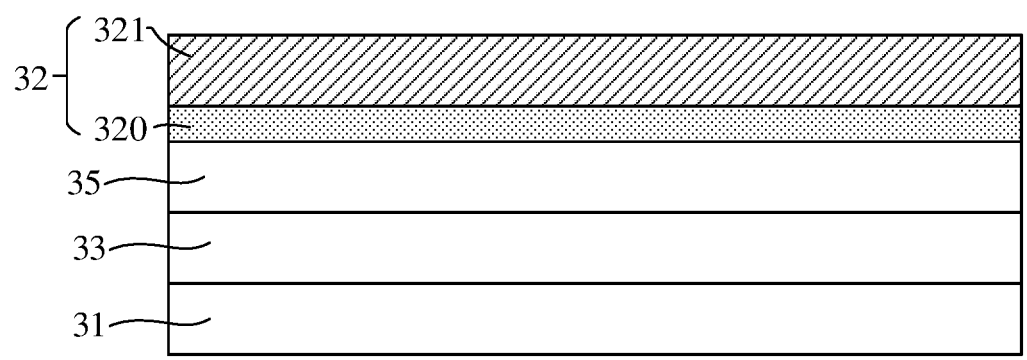

FIGS. 3A and 3B are schematic cross-sectional views of the display device taken along line I-I' in FIG. 2 according to the embodiments of the present disclosure. In some embodiments, referring to FIG. 3A, the touch layer 32 may be formed on the display unit 31 through a continuous process. Here, the expression "continuous process" may be understood as: the touch layer 32 may be formed directly above the display unit 31 after the display unit 31 is formed, instead of separately forming the display unit 31 and the touch layer 32, and then disposing the touch layer 32 on the display unit 31 through a process such as attaching. Referring to FIG. 3A, for example, when the touch layer 32 is formed in a electroluminescent display device, the touch layer 32 may be directly formed on an encapsulation layer 33. In addition, in order to avoid damage to the encapsulation layer 33 when the touch layer 32 is formed on the encapsulation layer 33, a buffer layer 34 may be formed on the encapsulation layer 33 before the touch layer 32 is formed on the encapsulation layer 33. In other embodiments, referring to FIG. 3B, the touch layer 32 may be formed as a separate element, and the touch layer 32 is attached to the display unit 31 through an adhesive layer 35. In the case that the touch layer 32 is formed as a separate element (for example, a separate film layer), the touch layer 32 may also include a carrier film for carrying touch electrodes. For example, in the embodiment shown in FIG. 3B, the touch layer 32 may include a touch electrode layer 321 and a carrier film 320 carrying the touch electrode layer.

For example, the carrier film 320 may be a resin film, a glass substrate, a composite film, etc.; the adhesive layer 35 may be a pressure sensitive adhesive (PSA), Optical Clear Adhesive (OCA), Optical Clear Resin (OCR), or the like.

It should be noted that, in the embodiment shown in FIG. 2, the display panel 3 may be rectangular in the plan view. The "rectangular" here includes not only a substantially rectangular shape, but also a shape similar to a rectangle in consideration of process conditions. On this basis, the display panel 3 includes a long side and a short side. In some embodiments, each intersection position (i.e, corner) of the long side and the short side of the display panel 3 is a right angle. In other embodiments, each corner of the display panel 3 is curved, that is, each corner is smooth.

In combination with the above embodiments, referring again to FIG. 2, the touch layer 32 may overlap with the display unit 31. In some embodiments, the touch layer 32 may have substantially the same size as the display unit 31. That is, as shown in FIGS. 3A and 3B, a side of the touch layer 32 may be aligned with a side of the display unit 31. However, the embodiments of the present disclosure are not limited to this. Optionally, the touch layer 32 may only overlap with a part of the display unit 31, for example, the touch layer 32 at least partially overlaps with the display area AA of the display unit 31.

It should be noted the touch layer 32 includes a touch area B1 that is provided with a plurality of touch electrodes, and a peripheral area B2 on a periphery of the touch area B1, and the peripheral area B2 is provided with touch leads that are electrically connected to the touch electrodes. In the case that the touch layer 32 has substantially the same size as the display unit 31, the touch area B1 corresponds to the display area AA, and the peripheral area B2 corresponds to the non-display area NA.

On this basis, as shown in FIG. 2, the cover plate 2 may include a light-transmitting area C1 and a light-shielding area C2. The light-transmitting area C1 may at least partially overlap with the display area AA of the display unit 31, and the light-transmitting area C1 may transmit light generated from the display unit 31 to outside, so that the light may be seen by human eyes. The light-shielding area C2 may be disposed at a periphery of the light-transmitting area C1, and the light shielding area C2 may at least partially overlap with the non-display area NA of the display unit 31.

Figure 4:
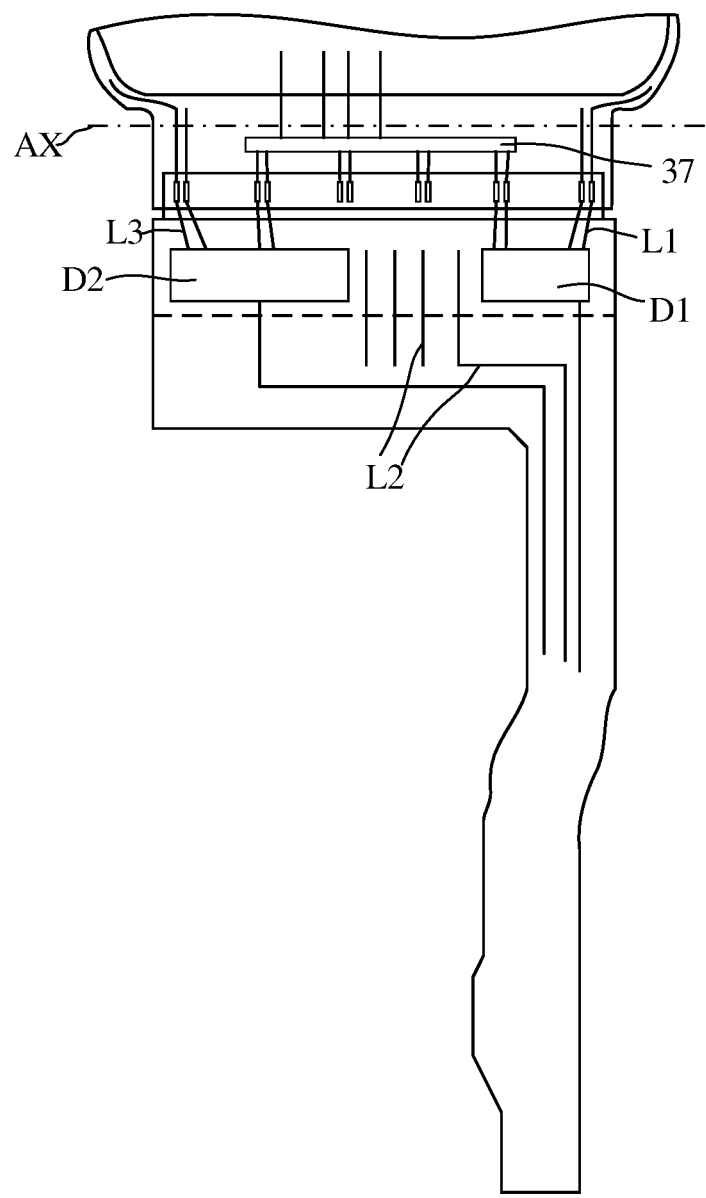
FIG. 4 is a schematic plan view of a flexible circuit board according to some exemplary embodiments of the present disclosure, which illustrates a connection of the flexible circuit board and a display panel.
Figure 5:
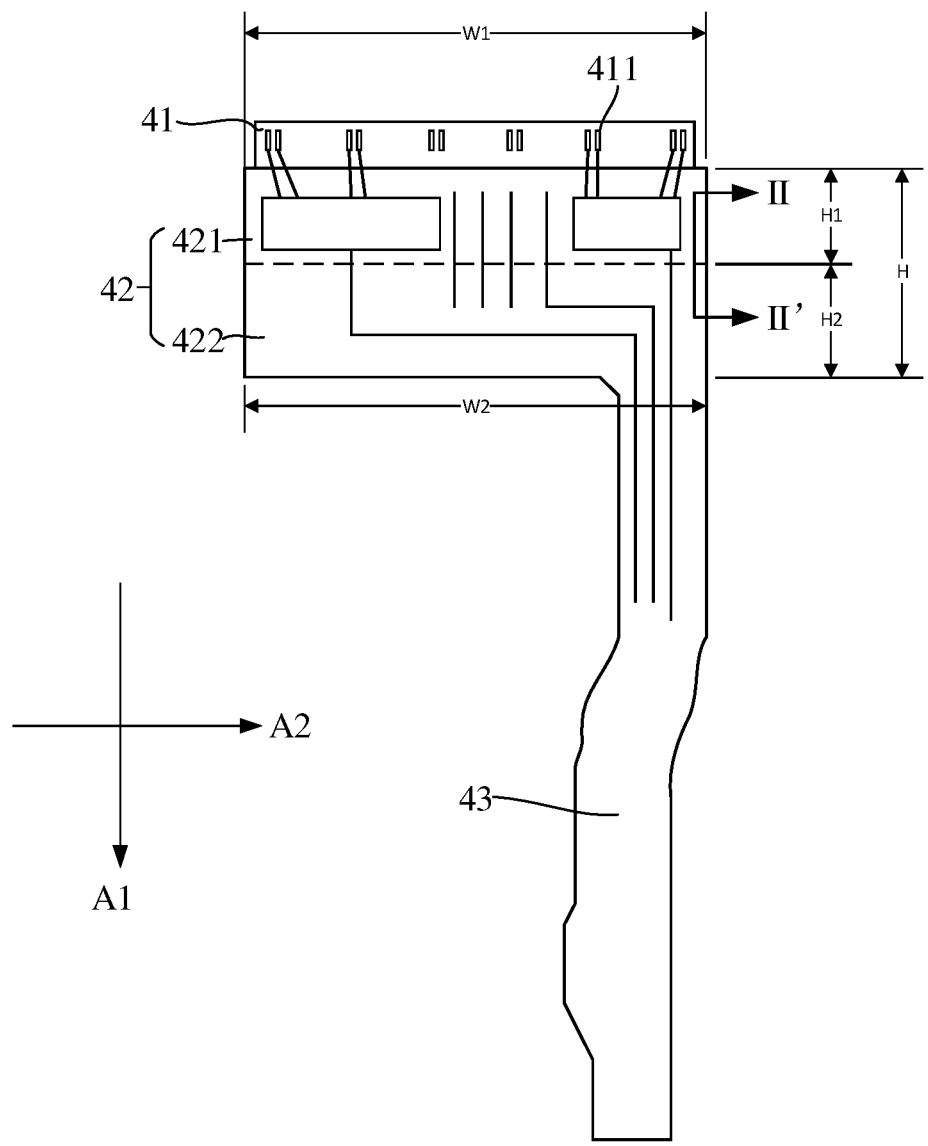
FIG. 5 is a schematic plan view of a flexible circuit board according to some exemplary embodiments of the present disclosure.

FIG. 4 is a schematic plan view of a flexible circuit board according to some exemplary embodiments of the present disclosure, which illustrates a connection of the flexible circuit board and a display panel. FIG. 5 is a schematic plan view of a flexible circuit board according to some exemplary embodiments of the present disclosure. With reference to FIGS. 2, 4 and 5 in combination, a part of the display panel may be bent in line AX toward the non-display side of the display panel 3, so that the flexible circuit board 4 is located on the back surface of the display panel 3. The flexible circuit board 4 may include a bonding area 41, a body area 42 and an extension area 43. The bonding area 41 and the extension area 43 are located on two sides of the body area 42, respectively.

The bonding area 41 of the flexible circuit board 4 may include a plurality of bonding pins 411. The non-display area NA of the display panel 3 may include a plurality of bonding pads. The plurality of bonding pins 411 are respectively bonded with the plurality of bonding pads, to achieve the bonding of the flexible circuit board 4 and the display panel 3.

For example, in some embodiments, as shown in FIG. 4, the non-display area NA of the display panel 3 further includes a driving circuit IC 37. Data signals sent by a main board is electrically connected to the driving circuit IC 37 through wirings (for example, collectively referred to as data signal control lines) of the flexible circuit board 4, the data signals are processed by the driving circuit IC 37 and finally output to the display panel 3, thereby the display panel 3 is driven for display.

The body area 42 of the flexible circuit board 4 may include one or more driving devices, such as a display driving device D1 and/or a touch driving device D2. The body area 42 of the flexible circuit board 4 may also include one or more wirings, for example, the wirings may include a first wiring L1, a second wiring L2 and a third wiring L3. Exemplarily, the first wiring L1 may be a signal wiring used to transmit data required for display, the second wiring L2 may be a power wiring L2, and the third wiring L3 may be a touch wiring L3. The signal wiring L1 may be electrically connected to the display driving device D1, and the touch wiring L3 may be electrically connected to the touch driving device D2.

It should be noted that, in FIG. 4, a rectangular frame is used to schematically illustrate the display driving device D1 and the touch driving device D2. However, this should not be regarded as a restriction on shapes of the display driving device D1 and the touch driving device D2. In addition, in the embodiments of the present disclosure, only the display driving device D1 and the touch driving device D2 are taken as examples to describe the body area 42 of the flexible circuit board 4, so as to illustrate that electronic elements and various wirings may be disposed in the body area 42. It should be understood that, the electronic elements disposed in the body area 42 of the flexible circuit board 4 are not limited to the display driving device D1 and the touch driving device D2. For example, in an area corresponding to the touch drive device D2, a touch IC, a touch driving element associated with the touch driving signals may be disposed, and other touch elements associated with the touch sensing signals may also be disposed.

For example, the driving device may include a driving IC chip. There are a plurality of methods (that is, the packaging method) to combine the driving IC chip to the flexible circuit board 4, for example, Tape Carrier Package (TCP), Chip on Film (COF) packaging, etc. In the TCP method, the flexible circuit board includes a plurality of contact pads, a plurality of pins of the driving IC chip and the plurality of contact pads of the flexible circuit board are soldered in one-to-one correspondence (such as eutectic soldering) or are electrically connected in one-to-one correspondence through anisotropic conductive adhesive (ACF), and at least the soldering part is protected by, for example, epoxy resin; in order to increase a bendability of the flexible circuit board in the TCP method, a slit may be formed in an packaging part. In the COF packaging method, the flexible circuit board includes a plurality of contact pads, a plurality of pins of the driving IC chip are directly crimped on the plurality of contact pads of the flexible circuit board through ACF, so that the plurality of pins of the driving IC chip are electrically connected to the plurality of contact pads of the flexible circuit board in one-to-one correspondence. For example, sizes and arrangements of the contact pads used to combine the driver IC chip on the flexible circuit board may be adjusted according to different types of packaging methods or driver IC chips to be packaged. For example, the contact pads may be arranged in a strip shape or in a rectangular shape. The embodiments of the present disclosure do not limit the packaging method of the driver IC chip.

It should be noted that the number of each of the first wiring L1, the second wiring L2 and the third wiring L3 are not limited, and the number may be one or more. Here, the "more" may be at least two, for example.

Continuing to refer to FIGS. 4 and 5, the one or more wirings included in the body area 42 may extend to the extension area 43 and are electrically connected to the main board through the binding area or a golden finger included in the extension area 43. For example, each of the first wiring L1 and the second wiring L2 may extend to the extension area 43. In this way, the data signal, the power signal, etc. sent by the main board may be transmitted to the display panel 3 through the wirings of the flexible circuit board 4.

Figure 6:
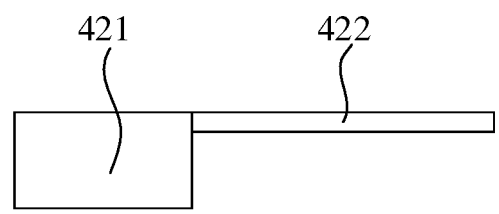
FIG. 6 is a cross-sectional view of the flexible circuit board taken along line II-If in FIG. 5 according to the embodiments of the present disclosure.

FIG. 6 is a cross-sectional view of the flexible circuit board taken along line II-If in FIG. 5 according to the embodiments of the present disclosure. With reference to FIGS. 5 and 6 in combination, the body area 42 of the flexible circuit board 4 includes a first sub-body area 421 and a second sub-body area 422. A thickness of the first sub-body area 421 is greater than a thickness of the second sub-body area 422.

It should be noted that, in the present disclosure, unless otherwise specified and limited, the expression "thickness" refers to a size in a direction perpendicular to the display surface of the display panel.

In some embodiments, the first sub-body area 421 includes a multi-layer board structure, for example, the first sub-body area 421 includes a four-layer board structure or a six-layer board structure. The second sub-body area 422 includes a single-layer board structure or a double-layer board structure. It should be noted that the embodiments of the present disclosure do not limit the number of layers of the first sub-body area 421 and the second sub-body area 422. In the embodiments of the present disclosure, the number of layers of the first sub-body area 421 is greater than the number of layers of the second sub-body area 422. In this way, the second sub-body area 422 is formed as a thinned area relative to the first sub-body area 421.

Figure 7:
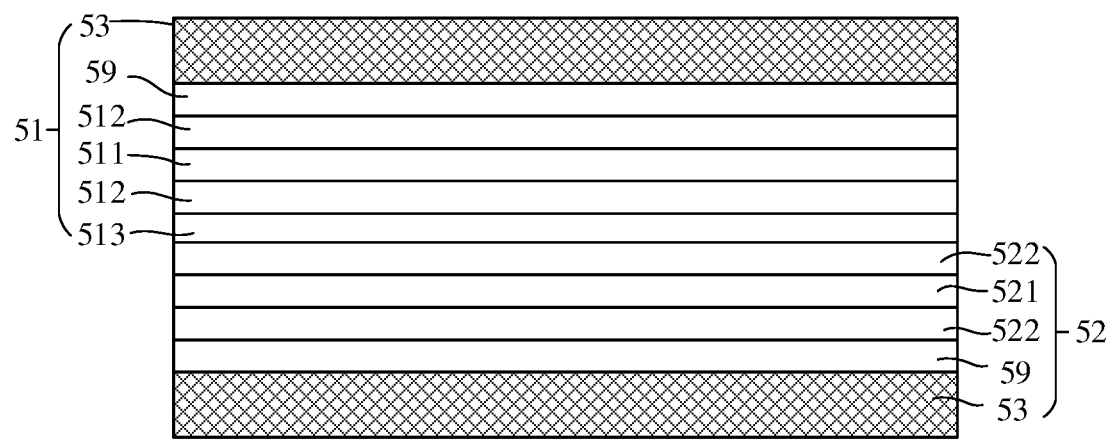
FIG. 7 is a cross-sectional view of a first sub-body area included in a flexible circuit board according to the embodiments of the present disclosure, which schematically illustrates a four-layer board structure of the first sub-body area.

FIG. 7 is a cross-sectional view of a first sub-body area included in a flexible circuit board according to the embodiments of the present disclosure, which schematically illustrates a four-layer board structure of the first sub-body area. As shown in FIG. 7, the first sub-body area 421 may include a first sub-circuit board 51 and a second sub-circuit board 52. For example, each sub-circuit board may be a copper clad laminate. The first sub-circuit board 51 may include a base film 511, conductive films 512 on opposite sides of the base film 511 and an adhesive layer 513 on a side of the base film 511. The second sub-circuit board 52 may include a base film 521 and conductive films 522 on opposite sides of the base film 521. The adhesive layer 513 may be disposed between the first sub-circuit board 51 and the second sub-circuit board 52. For example, the first sub-circuit board 51 may include an adhesive layer 513, and the adhesive layer 513 may be disposed on a side of the first sub-circuit board 51 close to the second sub-circuit board 52. Optionally, the adhesive layer may also be disposed on a side of the second sub-circuit board 52 close to the first sub-circuit board 51. In this way, the first sub-circuit board and the second sub-circuit board are bonded together through the adhesive layer 513.

Continuing to refer to FIG. 7, the first sub-circuit board 51 and the second sub-circuit board 52 may include an insulating film layer 59 and a protective film 53, respectively. For example, the insulating film layer 59 of the first sub-circuit board 51 is disposed on a side away from the second sub-circuit board 52, the insulating film layer 59 of the second sub-circuit board 52 is disposed on a side away from the first sub-circuit board 51. For example, the protective films 53 of the first sub-circuit board 51 and the protective films 53 of the second sub-circuit board 52 may be respectively disposed on a side of each insulating film layer 59 away from the base film, so as to protect each film layer inside.

It should be noted that the embodiments of the present disclosure are not limited to the embodiment shown in FIG. 7. For example, in other embodiments, the protective film 53 may also be disposed between two sub-circuit boards according to actual application requirements.

Figure 8:
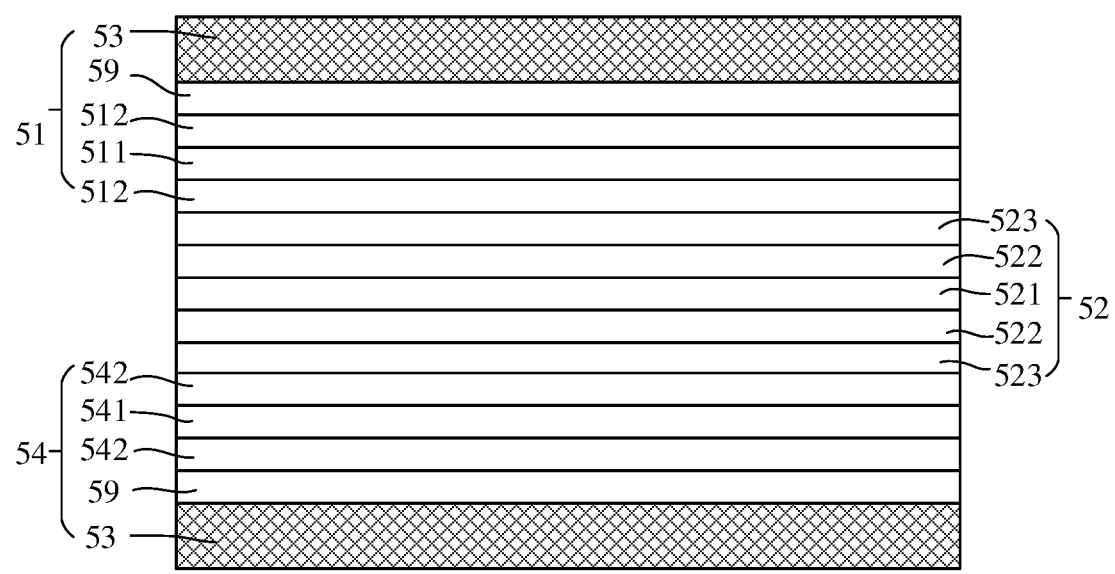
FIG. 8 is a cross-sectional view of a first sub-body area included in a flexible circuit board according to the embodiments of the present disclosure, which schematically illustrates a six-layer board structure of the first sub-body area.
Figure 9A:
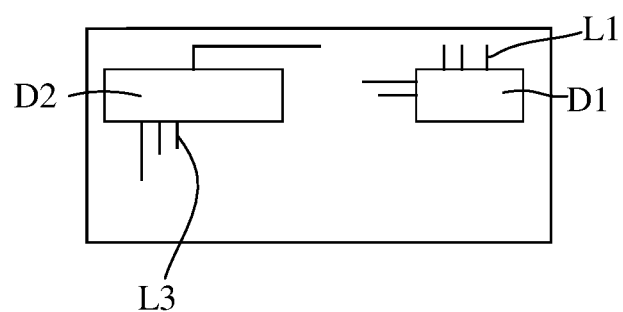
FIGS. 9A to 9F are schematic diagrams of layered wirings of the six-layer board structure shown in FIG. 8.
Figure 9B:
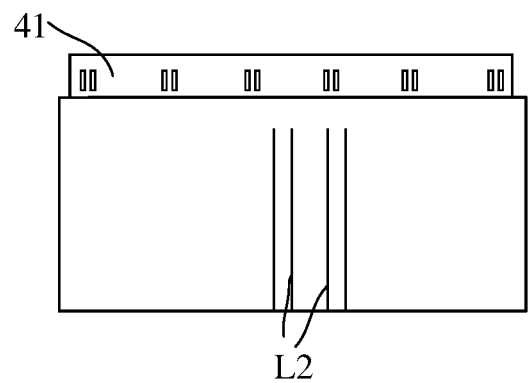
Figure 9C:
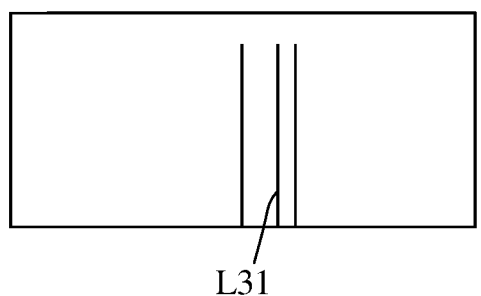
Figure 9D:
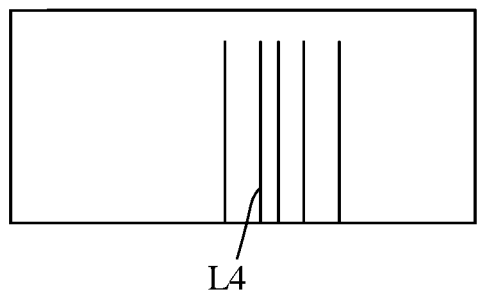
Figure 9E:
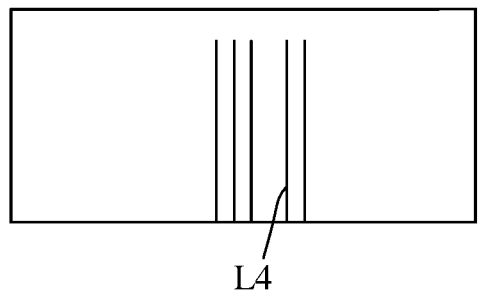
Figure 9F:

FIG. 8 is a cross-sectional view of a first sub-body area included in a flexible circuit board according to the embodiments of the present disclosure, which schematically illustrates a six-layer board structure of the first sub-body area. As shown in FIG. 8, the first sub-body area 421 may include a first sub-circuit board 51, a second sub-circuit board 52 and a third sub-circuit board 54. For example, each sub-circuit board may be a copper clad laminate. The first sub-circuit board 51 may include a base film 511, conductive films 512 on opposite sides of the base film 511 and an insulating film layer 59 on a side of the base film 511. The second sub-circuit board 52 may include a base film 521, conductive films 522 on opposite sides of the base film 521 and adhesive layers 523 on two sides of the base film 521. The third sub-circuit board 54 may include a base film 541, conductive films 542 on opposite sides of the base film 541 and an insulating film layer 59 on a side of the base film 541. An adhesive layer 523 may be disposed between the first sub-circuit board 51 and the second sub-circuit board 52, and another adhesive layer 523 may be disposed between the second sub-circuit board 52 and the third sub-circuit board 54. In this way, the first sub-circuit board, the second sub-circuit board and the third sub-circuit board are bonded together through the adhesive layers 523.

Continuing to refer to FIG. 8, the first sub-circuit board 51 and the third sub-circuit board 54 may include the insulating film layer 59 and a protective film 53, respectively. For example, the insulating film layer 59 of the first sub-circuit board 51 is disposed on a side away from the second sub-circuit board 52, the insulating film 59 of the third sub-circuit board 54 is disposed on a side away from the second sub-circuit board 52. For example, the protective film 53 of the first sub-circuit board 51 and the protective film 53 of the third sub-circuit board 54 may be respectively disposed on a side of each insulating film layer 59 away from the base film, so as to protect each film layer inside.

It should be noted that the embodiments of the present disclosure are not limited to the embodiments shown in FIG. 8. For example, in other embodiments, the protective film 53 may also be disposed between two sub-circuit boards according to actual application requirements.

For example, the base film may adopt a flexible material such as polyimide or polyester, and the conductive film may adopt a conductive metal material such as copper.

In the present disclosure, unless otherwise specified and limited, the numbers of layers in the expressions "single-layer board", "double-layer board", "four-layer board", "six-layer board", etc. indicate the number of layers of the conductive films of the flexible circuit board. For example, the "single-layer board" is disposed with one conductive film, the "double-layer board" is disposed with two conductive films, the "four-layer board" is disposed with four conductive films, and the "six-layer board" is disposed with six conductive films.

FIGS. 9A to 9F are schematic diagrams of layered wirings of the six-layer board structure shown in FIG. 8. With reference to FIGS. 8 and 9 in combination, the six-layer board structure of the first sub-body area 421 may include six conductive films. For ease of description, in FIG. 9, the six conductive films are described as a first layer AL1, a second layer AL2, a third layer AL3, a fourth layer AL4, a fifth layer AL5 and a sixth layer AL6, respectively.

The first layer AL1 includes driving devices D1, D2 and device wirings electrically connected to the driving devices D1, D2. For example, the device wirings may be a part of the first wiring L1 and a part of the third wiring L3 described above. The second layer AL2 includes the power wiring L2. The third layer AL3 includes a part of the touch wiring and a part of the power wiring. For example, the third wiring L3 may include an Rx wiring L31 for touch function, and the Rx wiring L31 is used to transmit signals to a touch receiving electrode. The part of the touch wiring here may include the Rx wiring L31. The fourth layer AL4 and the fifth layer AL5 may include other types of wiring L4. The sixth layer AL6 includes a part of the touch wiring. For example, the third wiring L3 may also include a Tx wiring L32 for touch function, the Tx wiring L32 is used to transmit signals to a touch sending electrode, and the part of the touch wiring here may include the Tx wiring L32.

It should be noted that the arrangements of the above-mentioned elements and wirings are only exemplary, and are not a limitation to the embodiments of the present disclosure. In other embodiments, the elements and wrings on each layer may be adjusted according to actual requirements. For example, some conductive layers may not be disposed with wirings. For example, the fourth layer AL4 and the fifth layer AL5 may not be disposed with wirings, but a shielding layer may be disposed in the fourth layer AL4 and the fifth layer AL5.

For example, the bonding area 41 and the bonding pins 411 may be disposed in the second layer AL2.

The power wiring L2, the Rx wiring L31 of the touch wiring L3, and the Tx wiring L32 of the touch wiring L3 are located in the second layer, the third layer and the sixth layer, respectively, and an orthographic projection of the power wiring L2 on the base film intersects with an orthographic projection of the touch wiring L3 on the base film. In the above embodiments, the shielding between the power wiring L2 and the touch wiring L3 is achieved by the shielding layer of the fourth layer AL4 and the shielding layer of the fifth layer AL5. For example, the shielding layer of the fourth layer AL4 and the shielding layer of the fifth layer AL5 may include a metal material, the shielding layer may be suspended, or configured to be electrically connected to a grounding wiring. In this way, signal interference between the power wiring L2 and the touch wiring L3 may be avoided. In practical applications, the shielding layer may be adjusted accordingly according to the number of layers of the flexible circuit board and the actual wiring layout.

Referring back to FIG. 8, the six-layer board structure of the first sub-body area 421 includes three sub-circuit boards, each sub-circuit board includes 2 layers of conductive film, that is, the six-layer board structure of the first sub-body area 421 has a combination of "2 layers+2 layers+2 layers".

Figure 10A:
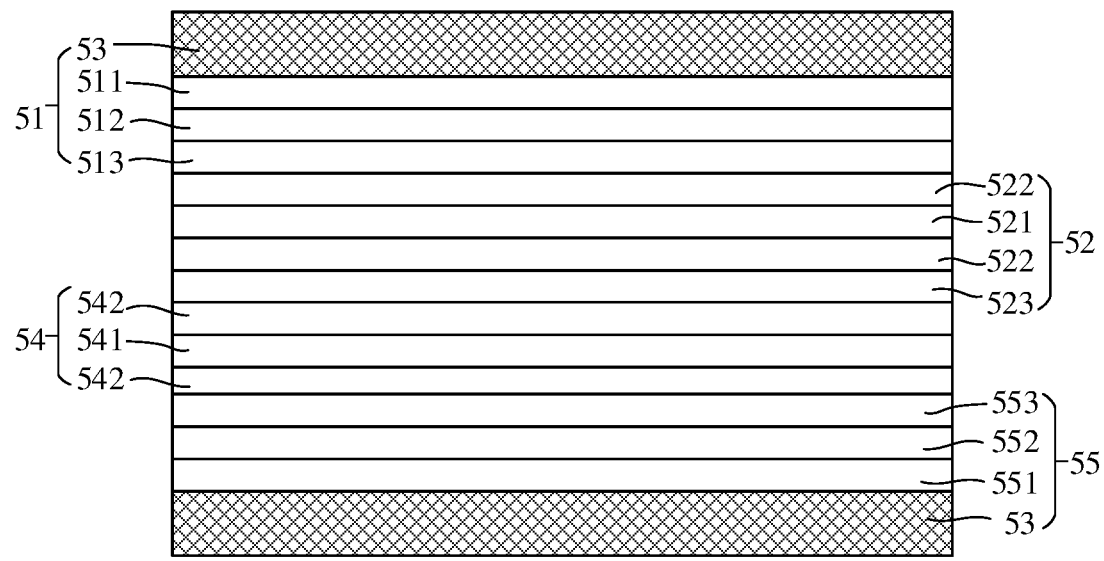
FIGS. 10A and 10B are cross-sectional views of a first sub-body area included in a flexible circuit board according to other embodiments of the present disclosure, which schematically illustrate a six-layer board structure of the first sub-body area, respectively.

Optionally, the six-layer board structure of the first sub-body area 421 may have a combination of "1 layer+2 layers+2 layers+1 layer". FIG. 10A is a cross-sectional view of a first sub-body area included in a flexible circuit board according to other embodiments of the present disclosure, which schematically illustrates a six-layer board structure of the first sub-body area. As shown in FIG. 10A, the first sub-body area 421 may include a first sub-circuit board 51, a second sub-circuit board 52, a third sub-circuit board 54 and a fourth sub-circuit board 55. For example, each sub-circuit board may be a copper clad laminate. The first sub-circuit board 51 may include a base film 511, a conductive film 512 on a side of the base film 511 and an adhesive layer 513 on a side of the conductive film 512 away from the base film 511. The second sub-circuit board 52 may include a base film 521, conductive films 522 on opposite sides of the base film 521 and an adhesive layer 523 on a side of a lower conductive film 522 away from the base film 521. The third sub-circuit board 54 may include a base film 541 and conductive films 542 on opposite sides of the base film 541. The fourth sub-circuit board 55 may include a base film 551, a conductive film 552 on a side of the base film 551 and an adhesive layer 553 on a side of the conductive film 552 away from the base film 551. The adhesive layer 513 may be disposed between the first sub-circuit board 51 and the second sub-circuit board 52, and the adhesive layer 523 may be disposed between the second sub-circuit board 52 and the third sub-circuit board 54. For example, the adhesive layer 513 of the first sub-circuit board may be disposed on a side close to the second sub-circuit board 52, the adhesive layer 523 of the second sub-circuit board may be disposed on a side close to the third sub-circuit board 54, and the adhesive layer 553 of the fourth sub-circuit board may be disposed on a side close to the third sub-circuit board 54. In this way, the first sub-circuit board, the second sub-circuit board, the third sub-circuit board and the fourth sub-circuit board are bonded together through the adhesive layers 513, 523, and 553.

Continuing to refer to FIG. 10A, the first sub-circuit board 51 and the fourth sub-circuit board 55 may include a protective film 53, respectively. For example, the protective film 53 of the first sub-circuit board 51 is disposed on a side away from the second sub-circuit board 52, the protective film 53 of the fourth sub-circuit board 55 is disposed on a side away from the third sub-circuit board 54.

Figure 10B:
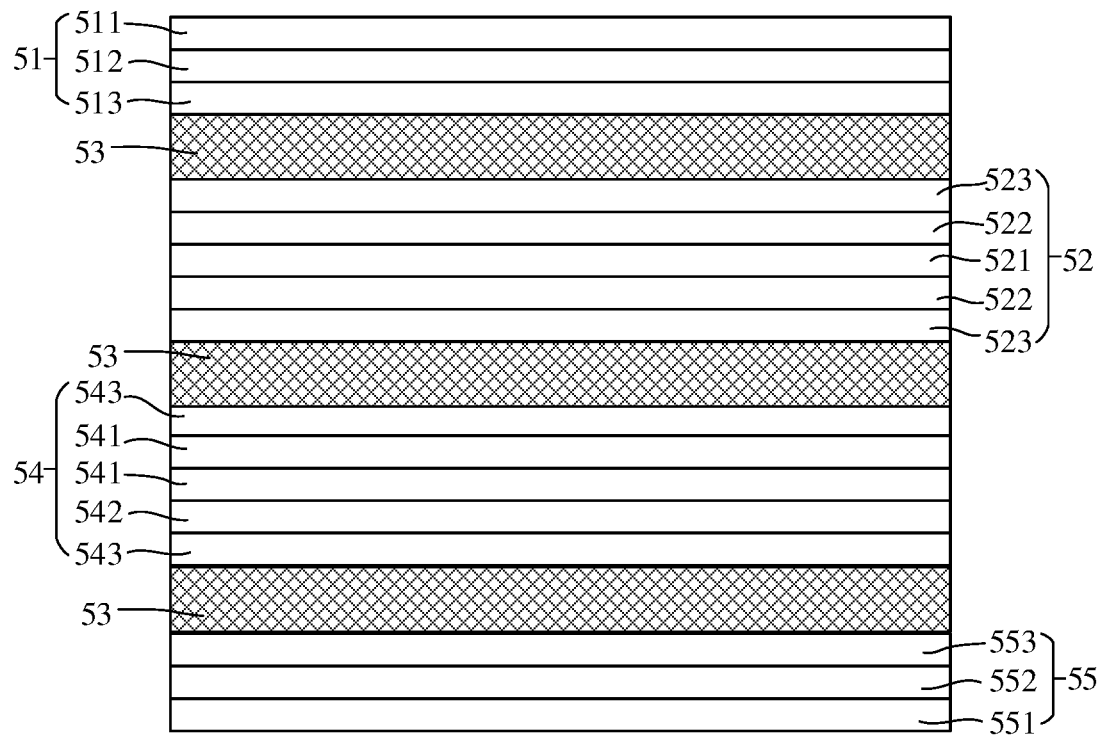

It should be noted that the embodiments of the present disclosure are not limited to the embodiment shown in FIG. 10A. For example, in other embodiments, the protective film 53 may also be disposed between two sub-circuit boards according to actual application requirements. For example, referring to FIG. 10B, a protective film 53 may be respectively disposed between a first sub-circuit board 51 and a second sub-circuit board 52, between the second sub-circuit board 52 and the third sub-circuit board 54, and between the third sub-circuit board 54 and the fourth sub-circuit board 55.

Figure 11:
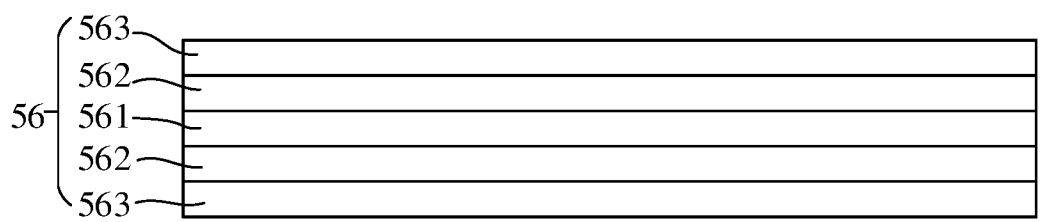
FIG. 11 is a cross-sectional view of a second sub-body area included in a flexible circuit board according to the embodiments of the present disclosure, which schematically illustrates a double-layer board structure of the second sub-body area.

FIG. 11 is a cross-sectional view of a second sub-body area included in a flexible circuit board according to the embodiments of the present disclosure, which schematically illustrates a double-layer board structure of the second sub-body area. As shown in FIG. 11, the second sub-body area 422 includes the double-layer board structure, and the double-layer board structure may include a double-layer sub-circuit board 56. For example, the double-layer sub-circuit board 56 may be a copper clad laminate. The double-layer sub-circuit board 56 may include a base film 561, conductive films 562 on opposite sides of the base film 561 and adhesive layers 563 on two sides of the conductive film 562 away from the base film 561.

Figure 21:
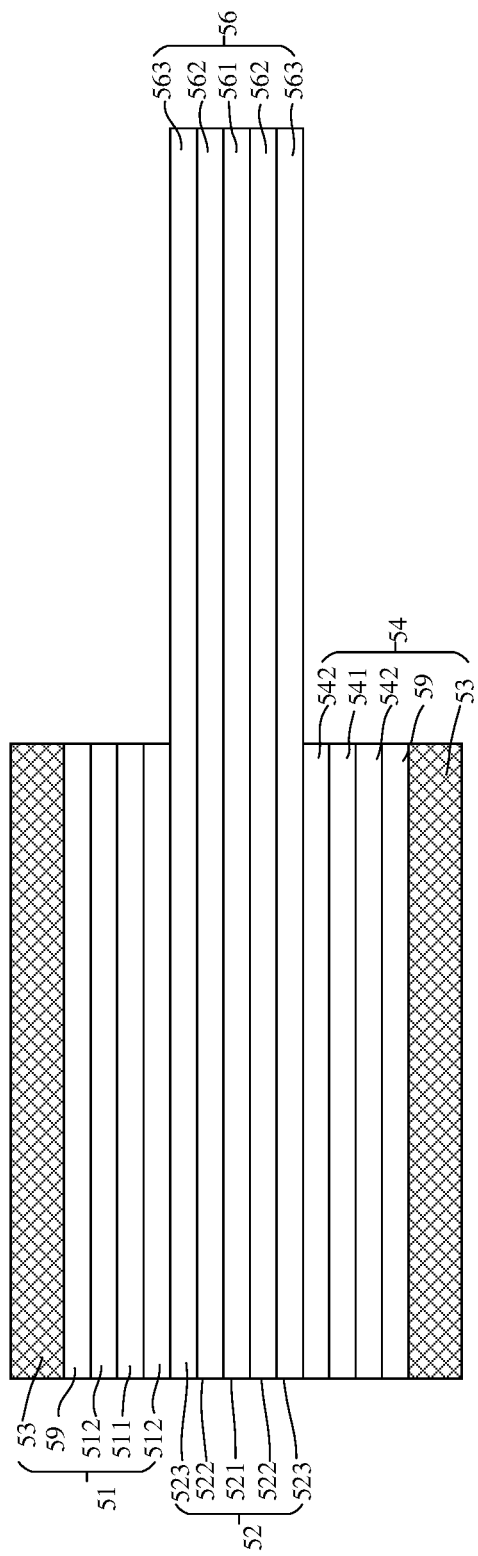
FIG. 21 is a cross-sectional view of a first sub-body area and a second sub-body area included in a flexible circuit board according to the embodiments of the present disclosure.

FIG. 21 is a cross-sectional view of a first sub-body area and a second sub-body area included in a flexible circuit board according to the embodiments of the present disclosure. With reference to FIGS. 8, 11 and 21 in combination, in the case that the six-layer board structure of the first sub-body area 421 adopts the layout of "2 layer+2 layer+2 layer", a double-layer sub-circuit board 56 of the second sub-body area 422 may be extracted from one of the first sub-circuit board 51, the second sub-circuit board 52 and the third sub-circuit board 54 in FIG. 8. That is, the double-layer sub-circuit board 56 of the second sub-body area 422 extends continuously with one of the first sub-circuit board 51, the second sub-circuit board 52, and the third sub-circuit board 54 in FIG. 8. For example, in the embodiment shown in FIG. 21, each of film layers 561, 562, and 563 in the double-layer sub-circuit board 56 respectively extends from each of film layers 521, 522, and 523 in the second sub-circuit board 52. In this way, a process of forming the body area may be simplified.

Figure 22:
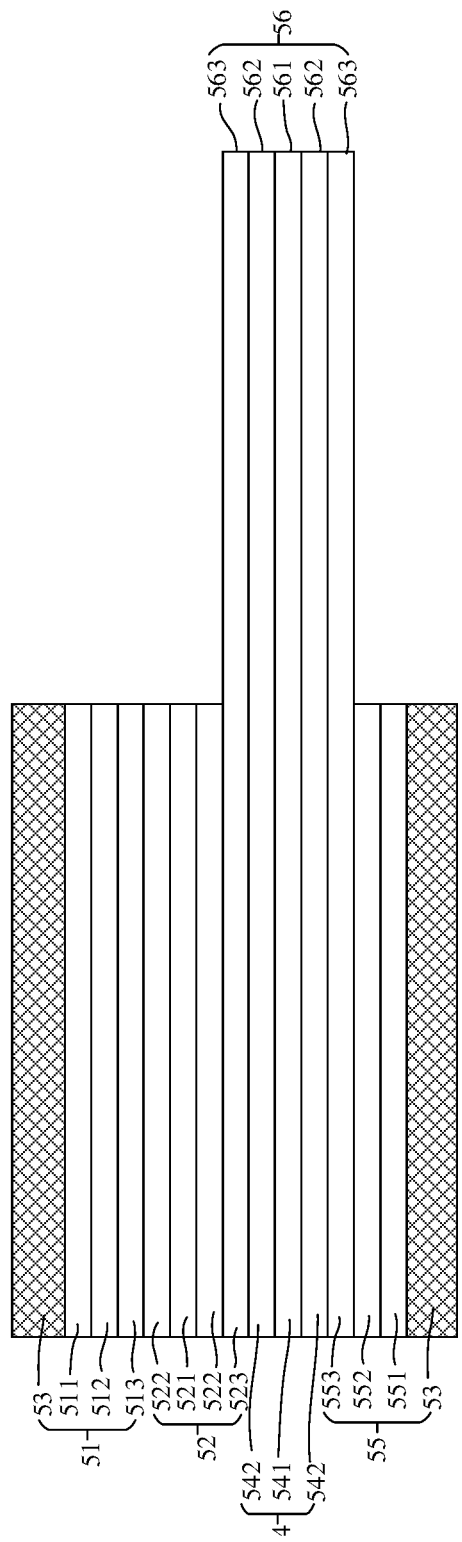
FIG. 22 is a cross-sectional view of a first sub-body area and a second sub-body area included in a flexible circuit board according to the embodiments of the present disclosure.

FIG. 22 is a cross-sectional view of a first sub-body area and a second sub-body area included in a flexible circuit board according to the embodiments of the present disclosure. With reference to FIGS. 10A, 11, and 22 in combination, in the case that the six-layer board structure of the first sub-body area 421 adopts the layout of "1 layer+2 layers+2 layers+1 layer", a double-layer sub-circuit board 56 of the second sub-body area 422 may be extracted from one of the second sub-circuit board 52 and the third sub-circuit board 54 in FIG. 10A. That is, the double-layer sub-circuit board 56 of the second sub-body area 422 extends continuously with one of the second sub-circuit board 52 and the third sub-circuit board 54 in FIG. 10A. For example, in the embodiment shown in FIG. 22, each of film layers 561 and 562 in the double-layer sub-circuit board 56 extend from each of film layers 541 and 542 in the third sub-circuit board 54 respectively. The adhesive layer 563 may extend from the adhesive layers 523 and 553 on two sides of the third sub-circuit board 54. In this way, a process of forming the body area may be simplified.

In some exemplary embodiments, the conductive film 562 on an upper side of the double-layer sub-circuit board 56 forms a first conductive layer, and the conductive film 562 on a lower side of the double-layer sub-circuit board 56 forms a second conductive layer. For example, the first conductive layer may include a signal wiring and a power wiring, that is, the first wiring L1 and second wiring L2 described above. The second conductive layer may also include a signal wiring and a power wiring, that is, the first wiring L1 and second wiring L2 described above. Optionally, the second conductive layer may include a shielding layer. For example, the shielding layer may include a metal material, and the shielding layer may be suspended, or configured to be electrically connected to a grounding wiring.

Figure 12:
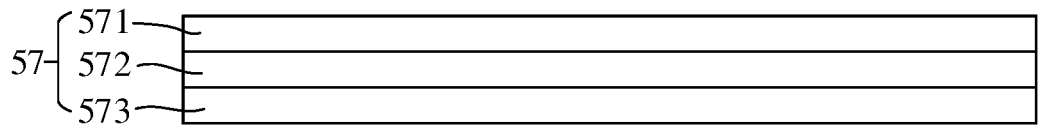
FIG. 12 is a cross-sectional view of a second sub-body area included in a flexible circuit board according to the embodiments of the present disclosure, which schematically illustrates a single-layer board structure of the second sub-body area.

FIG. 12 is a cross-sectional view of a second sub-body area included in a flexible circuit board according to the embodiments of the present disclosure, which schematically illustrates a single-layer board structure of the second sub-body area. As shown in FIG. 12, the second sub-body area 422 includes the single-layer board structure, and the single-layer board structure may include a single-layer sub-circuit board 57. For example, the single-layer sub-circuit board 57 may be a copper clad laminate. The single-layer sub-circuit board 57 may include a base film 571, a conductive film 572 on a side of the base film 571, and an adhesive layer 573 on a side of the conductive film 572 away from the base film 571.

Figure 23:
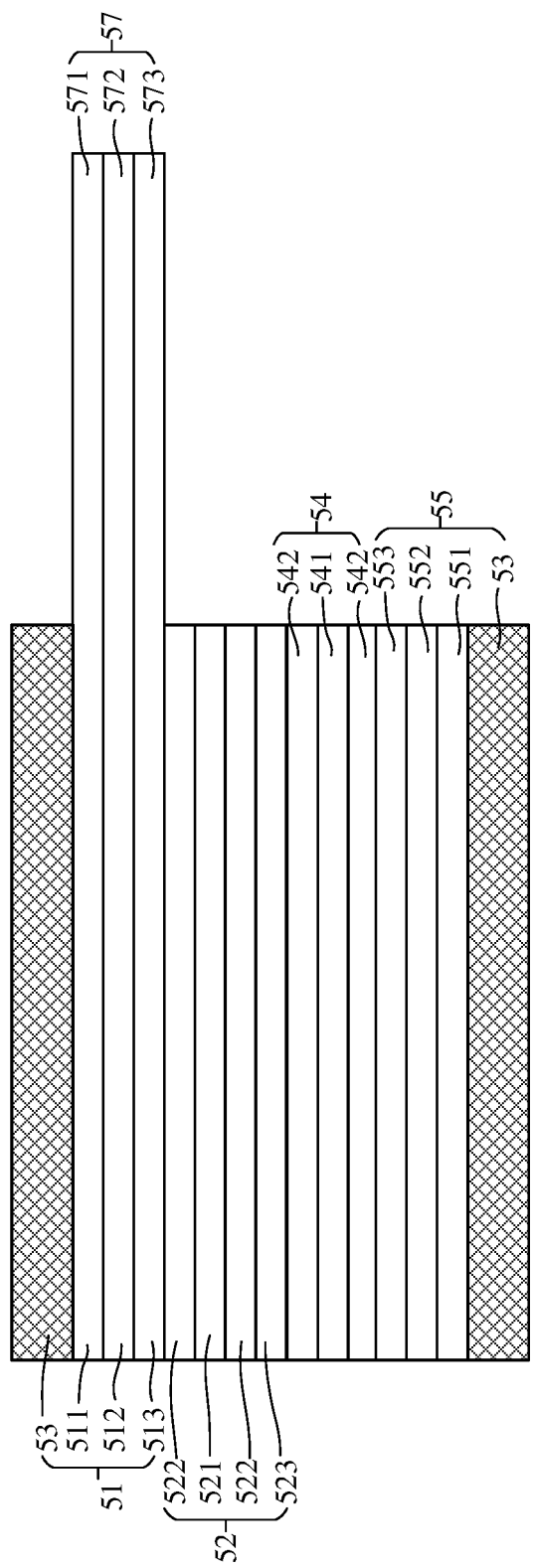
FIG. 23 is a cross-sectional view of a first sub-body area and a second sub-body area included in a flexible circuit board according to the embodiments of the present disclosure.

FIG. 23 is a cross-sectional view of a first sub-body area and a second sub-body area included in a flexible circuit board according to the embodiments of the present disclosure. With reference to FIGS. 10A, 12, and 23 in combination, in the case that the six-layer board structure of the first sub-body area 421 adopts the layout of "1 layer+2 layers+2 layers+1 layer", a single-layer sub-circuit board 57 of the second sub-body area 422 may be extracted from one of the first sub-circuit board 51 and the fourth sub-circuit board 55 in FIG. 10A. That is, the single-layer sub-circuit board 57 of the second sub-body area 422 extends continuously with one of the first sub-circuit board 51 and the fourth sub-circuit board 55 in FIG. 10A. For example, in the embodiment shown in FIG. 23, each of film layers 571, 572, and 573 in the single-layer sub-circuit board 57 extends from each of film layers 511, 512, and 513 in the first sub-circuit board 51, respectively. In this way, a process of forming the body area may be simplified.

In some exemplary embodiments, the conductive film 572 of the single-layer sub-circuit board 57 may include a signal wiring and a power wiring, that is, the first wiring L1 and second wiring L2 described above.

Referring back to FIG. 5, an orthographic projection of the combination of the first sub-body area 421 and the second sub-body area 422 (that is, the entire body area 42) on the display panel or the base film has a rectangular shape. The "rectangular" here includes not only a substantially rectangular shape, but also a shape similar to a rectangle in consideration of process conditions. On this basis, the body area 42 includes a long side and a short side. In some embodiments, each intersection position (i.e, corner) of the long side and the short side of the body area 42 has a right angle. In other embodiments, each corner of the body area 42 is curved, that is, each corner is smooth.

As shown in FIG. 5, a direction in which the short side of the body area 42 extends is defined as a first direction A1, and a direction in which the long side extends is defined as a second direction A2. A size of the body area 42 in the first direction A1 is H, a size of the first sub-body area 421 in the first direction A1 is H1, and a size of the second sub-body area 422 in the first direction A1 is H2. A size of the first sub-body area 421 in the second direction A2 is W1, and a size of the second sub-body area 422 in the second direction A2 is W2.

In the embodiments of the present disclosure, an area of an orthographic projection of the body area 42 on the display panel or the base film is associated with an area of an orthographic projection of the first sub-body area 421 on the display panel or the base film. For example, as an area of the first sub-body area 421 decreases, an area of the body area 42 needs to be increased. That is, when an area of the first sub-body area 421 with the six-layer board structure is decreased, the area of the entire body area 42 needs to be increased, that is, an area of the second sub-body area 422 needs to be increased. In this way, it is still ensured that there is sufficient wiring area to arrange the plurality of wirings.

In some embodiments, the size H of the body area 42 is associated with the size H1 of the first sub-body area 421. For example, as the size H1 of the first sub-body area 421 decreases, the size H of the body area 42 needs to be increased. For example, a ratio of the size H of the body area 42 to the size H1 of the first sub-body area 421 may be between 1.5 to 5. For example, the size H1 of the first sub-body area 421 may be within 5-10 mm, for example, about 7 mm; the size H of the body area 42 may be in a range of 7 to 20 mm, for example, about 12 mm.

It should be noted that a minimum value of the size H1 of the first sub-body area 421 needs to meet a signal shielding requirement. In the above exemplary embodiments, the minimum value of the size H1 of the first sub-body area 421 is set to about 5 mm to be able to meet the signal shielding requirement.

Continuing to refer to FIG. 5, the size W1 of the first sub-body area 421 is substantially equal to the size W2 of the second sub-body area 422. That is, an orthographic projection of each of the first sub-body area 421 and the second sub-body area 422 on the display panel or the base film has a rectangular shape. By designing such the regular shape, it is advantageous to achieve the process of forming the first sub-body area and the second sub-body area.

Figure 13:
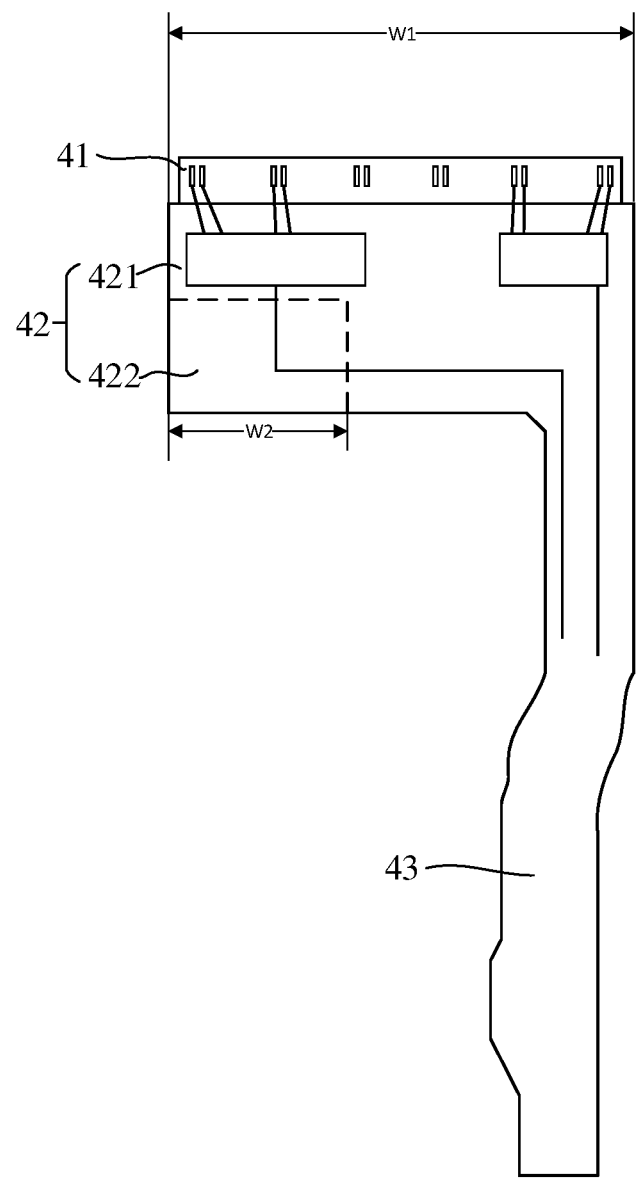
FIG. 13 is a schematic plan view of a flexible circuit board according to other embodiments of the present disclosure.

In the embodiments of the present disclosure, the shape and the position of the second sub-body area 422 may be designed according to actual avoidance requirements. FIG. 13 is a schematic plan view of a flexible circuit board according to other embodiments of the present disclosure. As shown in FIG. 13, the size W2 of the second sub-body area 422 is smaller than the size W1 of the first sub-body area 421. For example, the size W2 of the second sub-body area 422 may be less than or equal to half of the size W1 of the first sub-body area 421.

For example, the orthographic projection of the body area 42 on the display panel or the base film has a rectangular shape, the orthographic projection of the first sub-body area 421 on the display panel or the base film has an inverted L shape, and the orthographic projection of the second sub-body area 422 on the display panel or the base film has a rectangular shape.

In the embodiments of the present disclosure, the extension area 43 of the flexible circuit board 4 may include a double-layer board structure or a single-layer board structure. For example, the extension area 43 of the flexible circuit board 4 and the second sub-body area 422 of the flexible circuit board may extend continuously.

Figure 14:
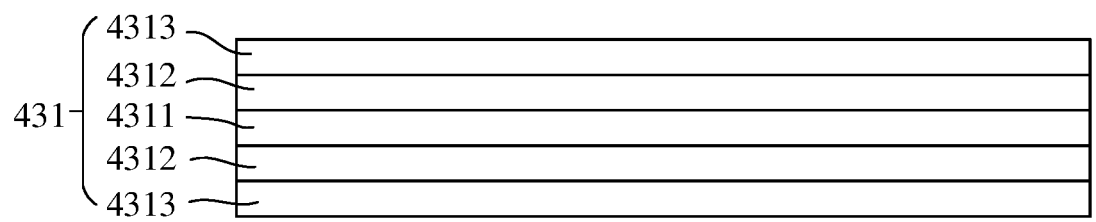
FIG. 14 is a cross-sectional view of an extension area included in a flexible circuit board according to the embodiments of the present disclosure, which schematically illustrates a double-layer board structure of the extension area.

For example, FIG. 14 is a cross-sectional view of an extension area included in a flexible circuit board according to the embodiments of the present disclosure, which schematically illustrates a double-layer board structure of the extension area. As shown in FIG. 14, the extension area 43 includes the double-layer plate structure, the double-layer board structure may include a double-layer sub-circuit board 431. For example, the double-layer sub-circuit board 431 may be a copper clad laminate. The double-layer sub-circuit board 431 may include a base film 4311, conductive films 4312 on opposite sides of the base film 4311 and adhesive layers 4313 on two sides of the conductive film 4312 away from the base film 4311.

The double-layer sub-circuit board 431 and the double-layer sub-circuit board 56 may be continuously extended.

For example, in the case that the six-layer board structure of the first sub-body area 421 adopts the layout of "2 layers+2 layers+2 layers", the double-layer sub-circuit board 431 may be extracted from one of the first sub-circuit board 51, the second sub-circuit board 52 and the third sub-circuit board 54 in FIG. 8. That is, the double-layer sub-circuit board 431 extends continuously with one of the first sub-circuit board 51, the second sub-circuit board 52 and the third sub-circuit board 54 in FIG. 8. For another example, in the case that the six-layer board structure of the first sub-body area 421 adopts the layout of "1 layer+2 layers+2 layers+1 layer", the double-layer sub-circuit board 431 may be extracted from one of the second sub-circuit board 52 and the third sub-circuit board 54 in FIG. 10A. That is, the double-layer sub-circuit board 431 extends continuously with one of the second sub-circuit board 52 and the third sub-circuit board 54 in FIG. 10A. In this way, the process of forming the body area may be simplified.

Figure 24:
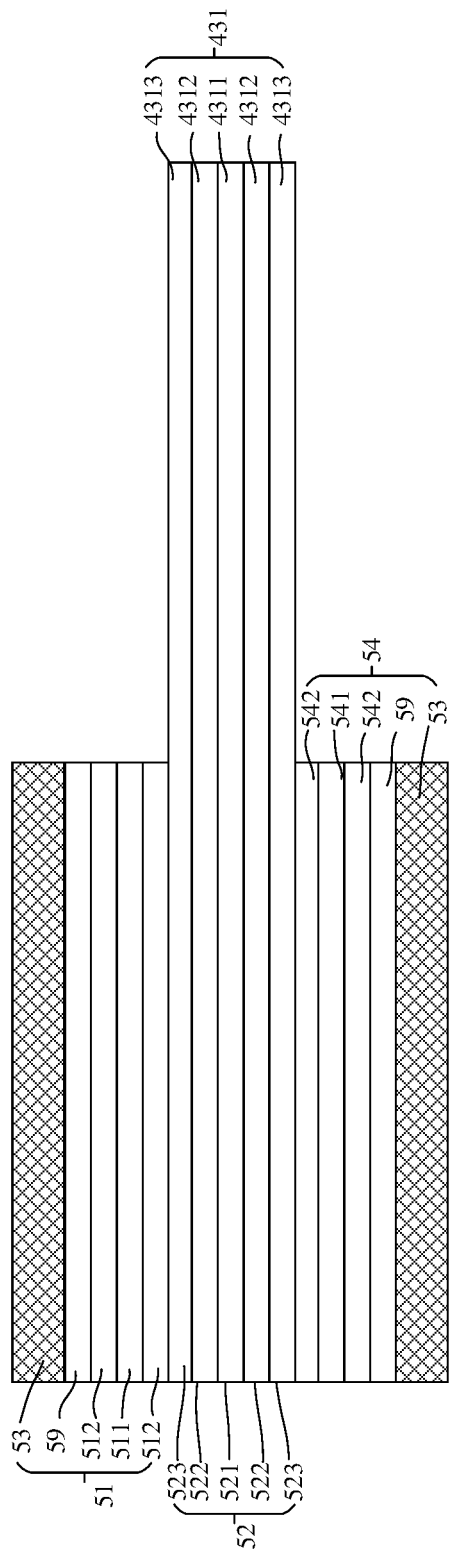
FIG. 24 is a cross-sectional view of a body area and an extension area included in a flexible circuit board according to the embodiments of the present disclosure.

FIG. 24 is a cross-sectional view of a body area and an extension area included in a flexible circuit board according to the embodiments of the present disclosure. Referring to FIG. 24, the double-layer sub-circuit board 431 may be extracted from the second sub-circuit board 52 in FIG. 10A. That is, each of film layers 4311, 4312, 4313 in the double-layer sub-circuit board 431 extend from each of film layers 521, 522, and 523 in the second sub-circuit board 52, respectively.

In some exemplary embodiments, the conductive film 4312 on an upper side of the double-layer sub-circuit board 431 forms a first conductive layer, and the conductive film 4312 on a lower side of the double-layer sub-circuit board 431 forms a second conductive layer. For example, the first conductive layer may include a signal wiring and a power wiring, that is, the first wiring L1 and the second wiring L2 described above. The second conductive layer may also include the signal wiring and the power wiring, that is, the first wiring L1 and the second wiring L2 described above. Optionally, the second conductive layer may include a shielding layer, For example, the shielding layer may include a metal material, and the shielding layer may be suspended, or configured to be electrically connected to a grounding wiring.

Figure 15:
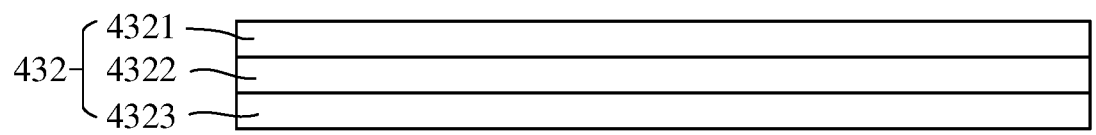
FIG. 15 is a cross-sectional view of an extension area included in a flexible circuit board according to the embodiments of the present disclosure, which schematically illustrates a single-layer board structure of the extension area.

FIG. 15 is a cross-sectional view of an extension area included in a flexible circuit board according to the embodiments of the present disclosure, which schematically illustrates a single-layer board structure of the extension area. As shown in FIG. 15, the extension area 43 includes the single-layer board structure, and the single-layer board structure may include a single-layer sub-circuit board 432. For example, the single-layer sub-circuit board 432 may be a copper clad laminate. The single-layer sub-circuit board 432 may include a base film 4321, a conductive film 4322 on a side of the base film 4321, and an adhesive layer 4323 on a side of the conductive film 4322 away from the base film 4321.

The single-layer sub-circuit board 432 and the single-layer sub-circuit board 57 may extend continuously. For example, in the case that the six-layer board structure of the first sub-body area 421 adopts the layout of "1 layer+2 layers+2 layers+1 layer", the single-layer sub-circuit board 432 may be extracted from one of the first sub-circuit board 51 and the fourth sub-circuit board 55 in FIG. 10A. That is, the single-layer sub-circuit board 432 continuously extends with one of the first sub-circuit board 51 and the fourth sub-circuit board 55 in FIG. 10A. In this way, the process of forming the extension area may be simplified.

Figure 25:
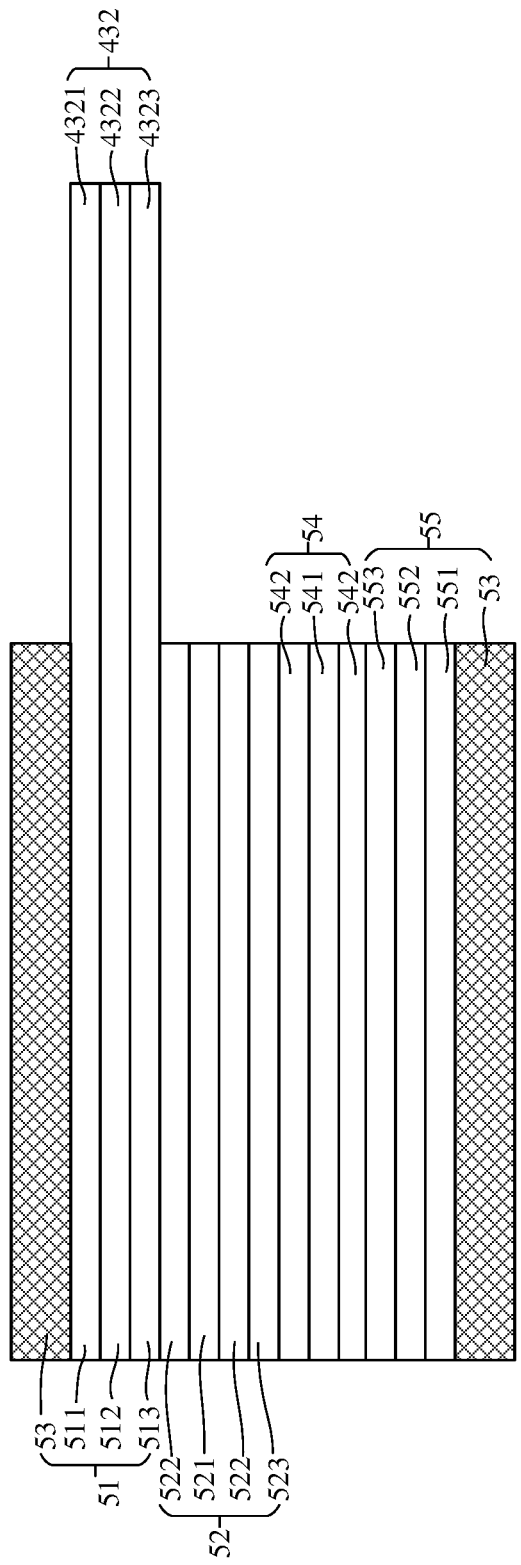
FIG. 25 is a cross-sectional view of a body area and an extension area included in a flexible circuit board according to the embodiments of the present disclosure.

FIG. 25 is a cross-sectional view of a body area and an extension area included in a flexible circuit board according to the embodiments of the present disclosure. Referring to FIG. 25, the single-layer sub-circuit board 432 may be extracted from the first sub-circuit board 51 in FIG. 10A. That is, each of film layers 4321, 4322, 4323 in the single-layer sub-circuit board 432 extend from each of film layers 511, 512, and 513 in the first sub-circuit board 51, respectively.

In some exemplary embodiments, the conductive film 4322 of the single-layer sub-circuit board 432 may include a signal wiring and a power wiring, that is, the first wiring L1 and the second wiring L2 described above.

In the above embodiments, the extension area of the flexible circuit board is designed to include the double-layer board structure or the single-layer board structure. In this way, it is convenient for the flexible circuit board to be bent in the extension area, and it is beneficial to bend the flexible circuit board to the back surface of the display panel to be electrically connected to the main board.

Figure 18:
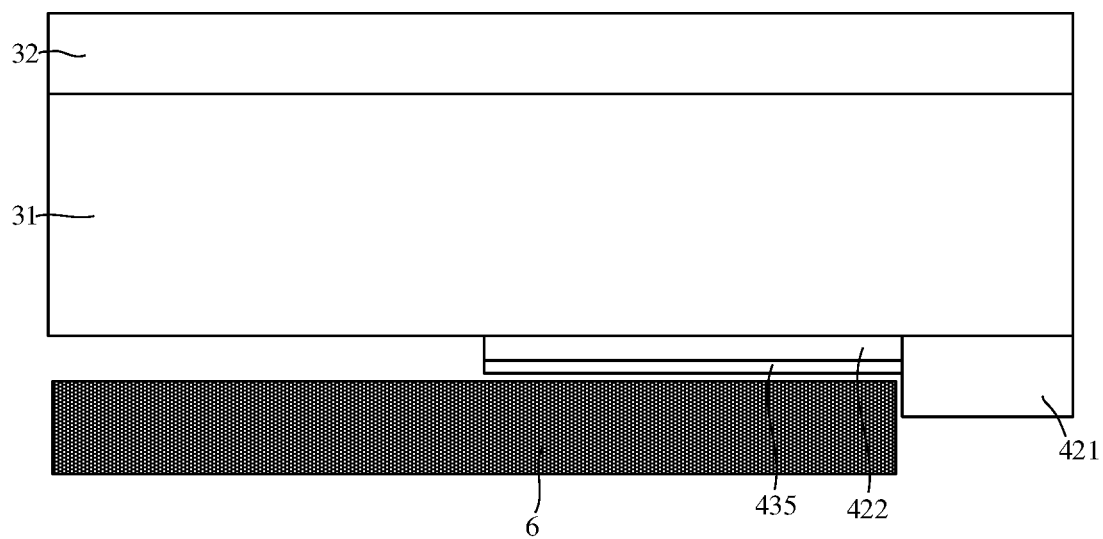
FIG. 18 is a partial enlarged view of the display device according to the embodiments of the present disclosure at part III in FIG. 1.

In some embodiments, an electromagnetic shielding layer 435 is disposed on a side (for example, a side away from the display panel) of the second sub-body area 422 and the extension area 43 of the flexible circuit board 4, as shown in FIG. 18. For example, the electromagnetic shielding layer 435 may be one or more of conductive rubber, conductive cloth, conductive foam and conductive shielding adhesive. By providing the electromagnetic shielding layer, the interference of external signals on signals transmitted by the wirings on the flexible circuit board may be shielded.

Figure 26:
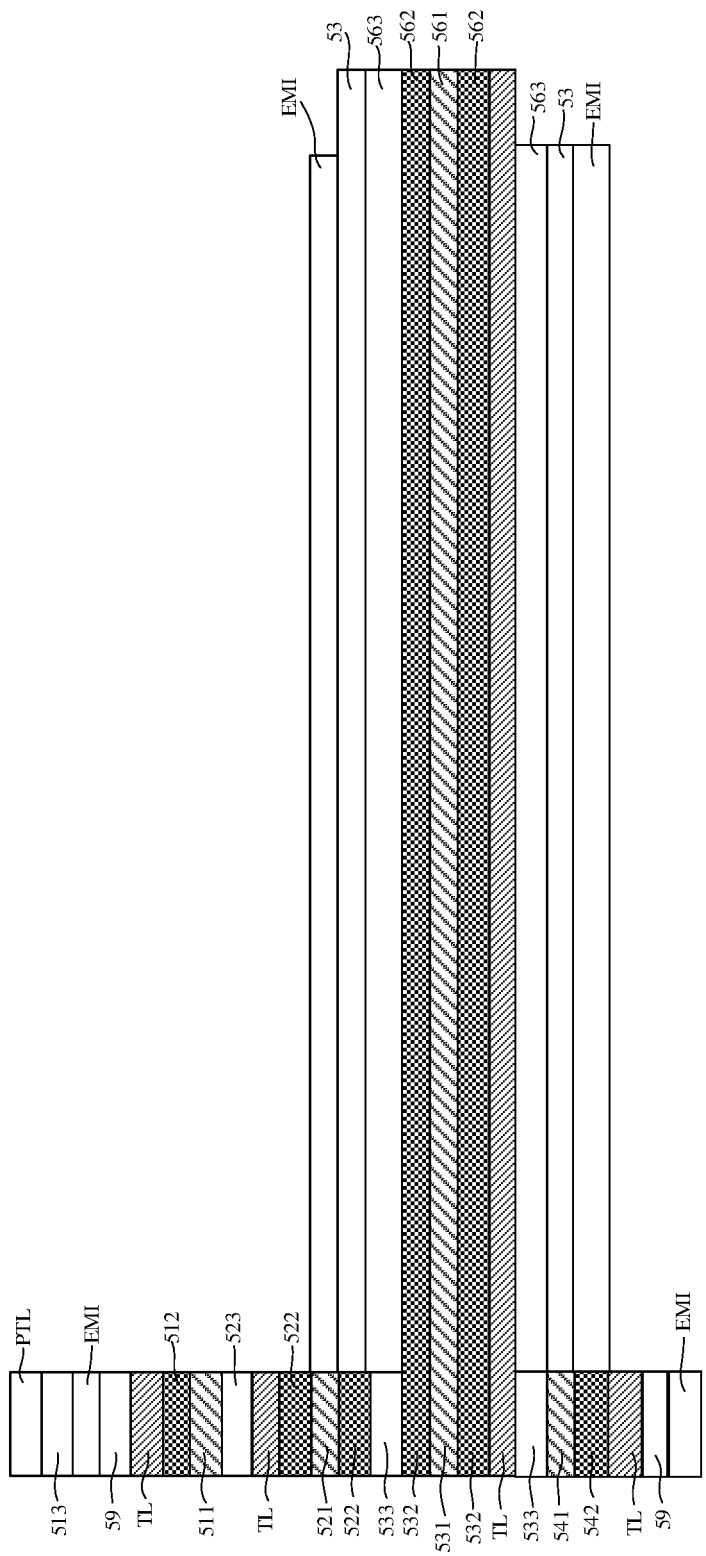
FIG. 26 is a cross-sectional view of a first sub-body area and a second sub-body area included in a flexible circuit board according to some exemplary embodiments of the present disclosure.

FIG. 26 is a cross-sectional view of a first sub-body area and a second sub-body area included in a flexible circuit board according to some exemplary embodiments of the present disclosure. Referring to FIG. 26, a left part corresponds to the first sub-body area, and a right part corresponds to the second sub-body area. The first sub-body area includes base films 511, 521, 531 and 541, a conductive film 512 is disposed on a side surface (upper surface) of the base film 511, conductive films 522 are respectively disposed on two sides of the base film 521, conductive films 532 are respectively disposed on two sides of the base film 531, a conductive film 542 is disposed on a side surface (lower surface) of the base film 541. That is, the first sub-body area includes six conductive films and has a combination of "1 layer+2 layers+2 layers+1 layer". The second sub-body area includes a base film 561, and conductive films 562 are respectively disposed on two sides of the base film 561. That is, the second sub-body area includes two conductive films.

In this embodiment, the second sub-body area extends continuously with the first sub-body area. Referring to FIG. 26, the base film 561 extends from the base film 531, and the conductive films 562 extend from the conductive films 532.

For example, a copper clad layer TL is disposed on at least one of the conductive films. Each of the wirings described above may be formed in the copper clad layer TL. That is, each wiring is formed by forming the copper clad layer TL on the conductive film and through patterning process such as a composition process.

It should be noted that in the embodiment shown in FIG. 26, only the conductive film 512, one conductive film 522, one conductive film 532/562 and the conductive film 542 are disposed with the copper clad layer TL, and the copper clad layer TL is not disposed on the other conductive film 522 and the other conductive film 532/562. Such arrangement is exemplary, and is not intended to limit the embodiments of the present disclosure. The conductive film corresponding to the copper clad layer may be determined according to the actual requirements of the wiring layout.

Continuing to refer to FIG. 26, the first sub-body area and the second sub-body area may further include an electromagnetic shielding layer EMI, the electromagnetic shielding layer EMI is used to protect electronic elements and wirings in the first sub-body area and the second sub-body area from external electromagnetic interference.

For example, adhesive layers 513, 523, 533, and 563 may also be disposed between the film layers. In the second sub-body area, a protective film 53 may be further disposed between the adhesive layer 563 and the electromagnetic shielding layer EMI.

For example, in the first sub-body area, a protective layer PTL may be disposed on a side of the adhesive layer 513 away from the base film. An insulating film layer 59 may also be disposed between the copper clad layer TL and the electromagnetic shielding layer EMI.

In the embodiments of the present disclosure, the bonding area 41 of the flexible circuit board 4 may include a double-layer board structure or a single-layer board structure. For example, the bonding area 41 of the flexible circuit board 4 may be extracted from one sub-circuit board of the six-layer board structure of the first sub-body area 421.

In some embodiments, extracting layers of the bonding area 41, the second sub-body area 422 and the extension area 43 of the flexible circuit board 4 may be the same. That is, the bonding area 41, the second sub-body area 422 and the extension area 43 are all extracted from the same sub-circuit board of the six-layer board structure of the first sub-body area 421. In this way, when the each wiring described above extends from one area to another area, the each wiring may extend in the same layer without extending to other layers through via holes, which is beneficial to reduce a impedance of the wiring.

Figure 16:
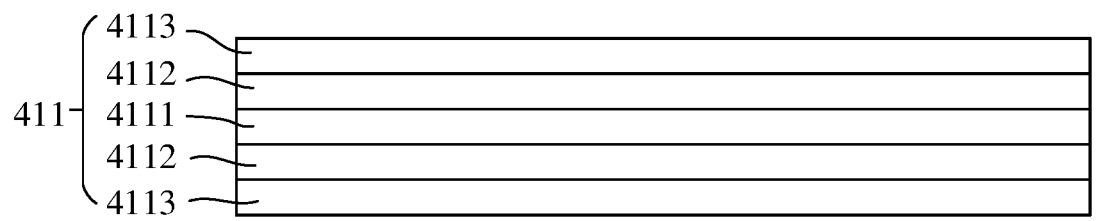
FIG. 16 is a cross-sectional view of a bonding area included in a flexible circuit board according to the embodiments of the present disclosure, which schematically illustrates a double-layer board structure of the bonding area.

For example, FIG. 16 is a cross-sectional view of a bonding area included in a flexible circuit board according to the embodiments of the present disclosure, which schematically illustrates a double-layer board structure of the bonding area. As shown in FIG. 16, the bonding area 41 includes the double-layer board structure, and the double-layer board structure may include a double-layer sub-circuit board 411. For example, the double-layer sub-circuit board 411 may be a copper clad laminate. The two-layer sub-circuit board 411 may include a base film 4111, conductive films 4112 on opposite sides of the base film 4111 and adhesive layers 4113 on a side of the conductive film 4112 away from the base film 4111, respectively.

The double-layer sub-circuit board 411 and the double-layer sub-circuit board 56 may extend continuously. For example, in the case that the six-layer board structure of the first sub-body area 421 adopts the layout of "2 layers+2 layers+2 layers", the double-layer sub-circuit board 411 may be extracted from one of the first sub-circuit board 51, the second sub-circuit board 52 and the third sub-circuit board 54 in FIG. 8. That is, the double-layer sub-circuit board 411 extends continuously with one of the first sub-circuit board 51, the second sub-circuit board 52 and the third sub-circuit board 54 in FIG. 8. For another example, in the case that the six-layer board structure of the first sub-body area 421 adopts the layout of "1 layer+2 layers+2 layers+1 layer", the double-layer sub-circuit board 411 may be extracted from one of the second sub-circuit board 52 and the third sub-circuit board 54 in FIG. 10A. That is, the double-layer sub-circuit board 411 extends continuously with one of the second sub-circuit board 52 and the third sub-circuit board 54 in FIG. 10A.

Figure 17:
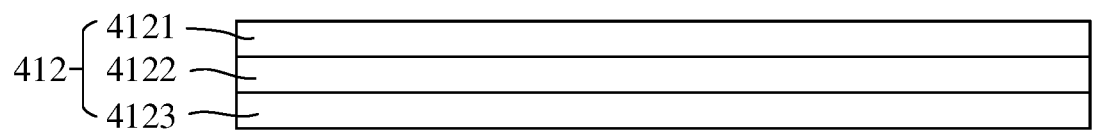
FIG. 17 is a cross-sectional view of a bonding area included in a flexible circuit board according to the embodiments of the present disclosure, which schematically illustrates a single-layer board structure of the bonding area.

FIG. 17 is a cross-sectional view of a bonding area included in a flexible circuit board according to the embodiments of the present disclosure, which schematically illustrates a single-layer board structure of the bonding area. As shown in FIG. 17, the bonding area 41 includes a single-layer board structure, and the single-layer board structure may include a single-layer sub-circuit board 412. For example, the single-layer sub-circuit board 412 may be a copper clad laminate. The single-layer sub-circuit board 412 may include a base film 4121, a conductive film 4122 on a side of the base film 4121, and an adhesive layer 4123 on a side of the conductive film 4122 away from the base film 4121.

The single-layer sub-circuit board 412 and the single-layer sub-circuit board 57 described above may extend continuously. For example, in the case that the six-layer board structure of the first sub-body area 421 adopts the layout of "1 layer+2 layers+2 layers+1 layer", the single-layer sub-circuit board 412 may be extracted from one of the first sub-circuit board 51 and the fourth sub-circuit board 55 in FIG. 10A. That is, the single-layer sub-circuit board 412 extends continuously with one of the first sub-circuit board 51 and the fourth sub-circuit board 55 in FIG. 10A.

In some embodiments, extracting layers of the bonding area 41 and the second sub-body area 422 of the flexible circuit board 4 may be different. For example, the bonding area 41 may be extracted from the second layer AL2 of the six-layer board structure of the first sub-body area 421, and the second sub-body area 422 may be extracted from the sixth layer AL6 of the six-layer board structure of the first sub-body area 421. In this embodiment, it may be ensured that the extension area of the flexible circuit board extends flatly from the first sub-body area, which is beneficial to the formation of the extension area.

Figure 19:
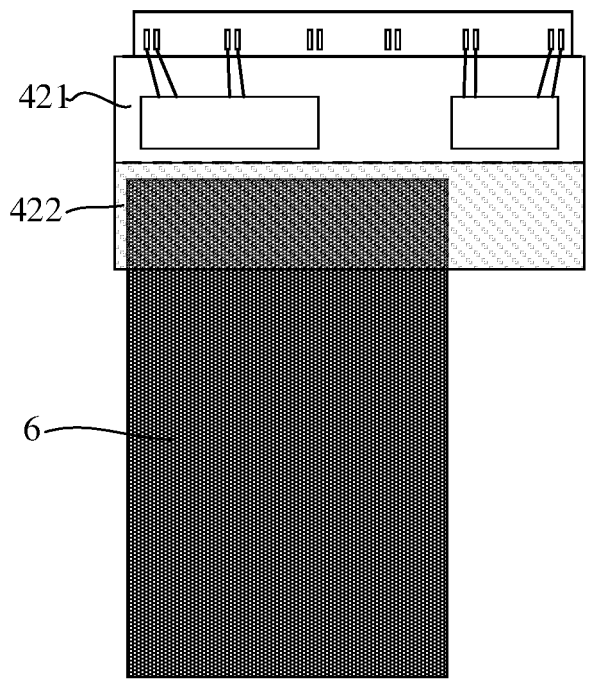
FIG. 19 is a schematic plan view of the display device shown in FIG. 18.

FIG. 18 is a partial enlarged view of the display device at part III in FIG. 1 according to the embodiments of the present disclosure. FIG. 19 is a schematic plan view of the display device shown in FIG. 18. With reference to FIGS. 1, 2, 18 and 19, the display device may also include a battery 6. It should be noted that the expression "battery" herein may include any form of power storage components, including but not limited to lithium batteries, battery compartments with protective shells and the like.

An orthographic projection of the battery 6 on the display panel 3 do not overlap with the orthographic projection of the first sub-body area 421 on the display panel 3. The first sub-body area 421 includes a thicker six-layer board structure, and the battery 6 or a middle frame component 7 does not extend below the first sub-body area 421.

The orthographic projection of the battery 6 on the display panel 3 at least partially overlaps with the orthographic projection of the body area 42 on the display panel 3. For example, the orthographic projection of the battery 6 on the display panel 3 at least partially overlaps with the orthographic projection of the second sub-body area 422 on the display panel 3.

In the embodiments of the present disclosure, by designing the second sub-body area 422 thinner than the first sub-body area 421, the battery 6 may extend below the second sub-body area 422. In this way, an area of the battery 6 equipped in the display device may be increased, and accordingly, a capacity of the battery 6 may be increased.

Figure 20:
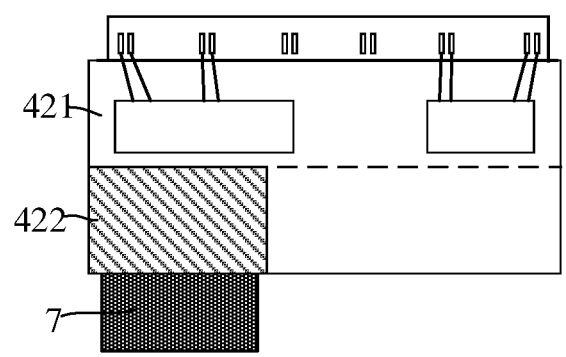
FIG. 20 is a partial plan view of the display device of the embodiments shown in FIG. 13.

It should be noted that, the embodiments of the present disclosure are not limited to an interference avoiding of the battery 6. By designing the thinned second sub-body area 422, other components of the display device (for example, the middle frame component) may extend below the second sub-body area, so as to achieve the purpose of interference avoiding. For example, FIG. 20 is a partial plan view of the display device of the embodiment shown in FIG. 13. As shown in FIG. 20, the display device includes a middle frame component 7, the middle frame component 7 may extend below the second sub-body area 422. That is, an orthographic projection of the middle frame component 7 on the display panel 3 at least partially overlaps with the orthographic projection of the second sub-body area 422 on the display panel 3. Therefore, through such design, components such as the battery, the middle frame component, etc. may be avoided from interference. When the display device is a small-sized display device such as a mobile phone, such design of interference avoiding is particularly advantageous.

In the specific implementation process, the flexible circuit board 4 may be bent to the back surface of the display panel to achieve the narrow bezel design of the display device. The display device provided by the embodiments of the present disclosure may be any product or component with a display function, such as a mobile phone, a tablet computer, a television, a display, a laptop computer, a digital photo frame, a navigator and the like. Other indispensable components of the display device are understood by those skilled in the art, which will not be repeated here, and should not be used as a limitation to the embodiments of the present disclosure.

The descriptions above are only specific implementations of the present disclosure, but the protection scope of the present disclosure is not limited thereto. Within the technical scope disclosed in the present disclosure, any changes or substitutions that may be easily conceived by those skilled in the art should fall within the protection scope of the present disclosure. Therefore, the protection scope of the present disclosure should be subject to the protection scope of the claims.

What is claimed is:

1. A display device, wherein the display device comprises:
    a display panel;
    a flexible circuit board; and
    a battery,
    wherein the flexible circuit board comprises:
    a body area comprising at least one driving device and a plurality of wirings;
    a bonding area combined with a first side of the body area, and the bonding area comprises a plurality of bonding pins; and
    an extension area combined with a second side of the body area, and the first side and the second side are two opposite sides of the body area,
    wherein the body area comprises a first sub-body area and a second sub-body area, and the second sub-body area is located on a side of the first sub-body area close to the extension area; the plurality of wirings at least comprise a first wiring, a second wiring and a third wiring, each of the first wiring, the second wiring and the third wiring extends in the first sub-body area, and the first wiring and the second wiring extend in the second sub-body area;
    the first sub-body area comprises a multi-layer board structure, the second sub-body area comprises a single-layer board structure or a double-layer board structure, and a thickness of the second sub-body area is smaller than a thickness of the first sub-body area; and
    the at least one driving device is arranged in the first sub-body area;
    wherein the bonding area of the flexible circuit board is connected to the display panel, and the flexible circuit board is located on a non-display side of the display panel; and
    the battery is located on a side of the flexible circuit board away from the display panel.

2. The display device of claim 1, wherein an orthographic projection of the battery on the display panel at least partially overlaps with an orthographic projection of the second sub-body area on the display panel.

3. The display device of claim 1, wherein the display device further comprises a middle frame component, at least a part of the middle frame component is located on a side of the flexible circuit board away from the display panel, and an orthographic projection of the middle frame component on the display panel at least partially overlaps with an orthographic projection of the second sub-body area on the display panel.

4. The display device of claim 1, wherein the first sub-body area comprises a first size in a first direction, the first direction is perpendicular to a thickness direction of the flexible circuit board, and the first direction is directed from the bonding area to the extension area; and
    the second sub-body area comprises a second size in the first direction, a ratio of a sum of the first size and the second size to the first size of the first sub-body area is in a range of 1.5 to 5.

5. The flexible circuit board of claim 4, wherein the first size is in a range of 5 to 10 mm; and/or, the sum of the first size and the second size is in a range of 7 to 20 mm.

6. The flexible circuit board of claim 4, wherein the first sub-body area comprises a third size in a second direction, the second sub-body area comprises a fourth size in the second direction, the second direction is perpendicular to the thickness direction of the flexible circuit board, and the second direction is perpendicular to the first direction; and
    the third size is equal to the fourth size, or the third size is greater than the fourth size.

7. The flexible circuit board of claim 4, wherein as the first size of the first sub-body area increases, an area of an orthographic projection of the second sub-body area in the thickness direction of the flexible circuit board becomes decreases.

8. The flexible circuit board of claim 1, wherein the first sub-body area comprises a four-layer board structure.

9. The flexible circuit board of claim 8, wherein the first sub-body area comprises a first sub-circuit board, a second sub-circuit board and a protective film, and each of the first sub-circuit board and the second sub-circuit board comprises a base film and conductive films on opposite sides of the base film.

10. The flexible circuit board of claim 1, wherein the first sub-body area comprises a six-layer board structure.

11. The flexible circuit board of claim 10, wherein the first sub-body area comprises a first sub-circuit board, a second sub-circuit board, a third sub-circuit board and a protective film, and each of the first sub-circuit board, the second sub-circuit board and the third sub-circuit board comprises a base film and conductive films on opposite sides of the base film.

12. The flexible circuit board of claim 11, wherein the second sub-body area comprises the double-layer board structure, the double-layer board structure comprises a double-layer sub-circuit board, and the double-layer sub-circuit board comprises a base film and conductive films on opposite sides of the base film, and wherein one of the first sub-circuit board, the second sub-circuit board and the third sub-circuit board extends continuously with the double-layer sub-circuit board.

13. The flexible circuit board of claim 12, wherein the bonding area comprises a double-layer board structure or a single-layer board structure.

14. The flexible circuit board of claim 13, wherein the bonding area and the second sub-body area are extracted from one of the sub-circuit boards of the first sub-body area.

15. The flexible circuit board of claim 13, wherein the bonding area and the second sub-body area are extracted from different ones of the sub-circuit boards of the first sub-body area.

16. The flexible circuit board of claim 10, wherein the first sub-body area comprises a first sub-circuit board, a second sub-circuit board, a third sub-circuit board, a fourth sub-circuit board and a protective film, each of the first sub-circuit board and the fourth sub-circuit board comprises a base film and a conductive film on a side of the base film, each of the second sub-circuit board and the third sub-circuit board comprises a base film and conductive films on opposite sides of the base film, and an adhesive layer is disposed between the first sub-circuit board and the second sub-circuit board, between the second sub-circuit board and the third sub-circuit board, and between the third sub-circuit board and the fourth sub-circuit board.

17. The flexible circuit board of claim 16, wherein the second sub-body area comprises the double-layer board structure, the double-layer board structure comprises a double-layer sub-circuit board, and the double-layer sub-circuit board comprises a base film and conductive films on opposite sides of the base film, and
wherein one of the second sub-circuit board and the third sub-circuit board extends continuously with the double-layer sub-circuit board.

18. The flexible circuit board of claim 16, wherein the second sub-body area comprises the single-layer board structure, the single-layer board structure comprises a single-layer sub-circuit board, and the single-layer sub-circuit board comprises a base film and a conductive film on a side of the base film, and
wherein one of the first sub-circuit board and the fourth sub-circuit board extends continuously with the single-layer sub-circuit board.

19. The flexible circuit board of claim 1, wherein the extension area comprises a double-layer board structure or a single-layer board structure, and
wherein the extension area and the second sub-body area extend continuously.

* * * * *